United States Patent [19]
Lee et al.

[11] Patent Number: 5,774,396
[45] Date of Patent: Jun. 30, 1998

[54] FLASH MEMORY WITH ROW REDUNDANCY

[75] Inventors: Peter W. Lee, Saratoga, Calif.; Hsing-Ya Tsao; Fu-Chang Hsu, both of Taipei, Taiwan

[73] Assignee: Aplus Integrated Circuits, Inc., Saratoga, Calif.

[21] Appl. No.: 762,707

[22] Filed: Dec. 9, 1996

Related U.S. Application Data

[63] Continuation-in-part of Ser. No. 624,322, Mar. 29, 1996, Pat. No. 5,646,890, Ser. No. 645,630, May 14, 1996, Pat. No. 5,687,121, Ser. No. 664,639, Jun. 17, 1996, Ser. No. 676,066, Jul. 5, 1996, and Ser. No. 691,281, Aug. 1, 1996.

[51] Int. Cl.$^6$ .................................................. G11C 16/06
[52] U.S. Cl. ............................... 365/185.09; 365/185.11; 365/185.29
[58] Field of Search .................... 365/185.09, 185.06, 365/185.11, 185.29, 189.07, 185.33

[56] References Cited

U.S. PATENT DOCUMENTS

| | | | |
|---|---|---|---|
| 5,233,559 | 8/1993 | Brennan, Jr. | 365/200 |
| 5,426,608 | 6/1995 | Higashitani | 365/200 |
| 5,596,535 | 1/1997 | Mushya | 365/200 |
| 5,621,690 | 4/1997 | Jungroth | 365/200 |

*Primary Examiner*—David C. Nelms
*Assistant Examiner*—Son Mai
*Attorney, Agent, or Firm*—Flehr Hohbach Test Albritton & Herbert LLP

[57] ABSTRACT

The invention provides a flash memory with row redundancy. The memory includes an input terminal to receive an address and a command signal. A plurality of flash memory arrays are arranged as blocks, where each block includes a plurality of transistors organized in rows and columns and having respective wordlines, bitlines and a sourceline. A wordline decoder is coupled to the input terminal and a portion of the plurality of blocks and configured to decode a portion of the address and to receive a control signal to selectively apply a predetermined voltage to a wordline. A bitline decoder is coupled to the input terminal and to the plurality of blocks and configured to decode a portion of the address and to selectively pass a predetermined bitline to an output terminal. A match circuit is coupled to the input terminal and to a portion of the plurality of blocks and configured to decode a portion of the address and to receive the control signal to selectively apply a predetermined voltage to a wordline. A control circuit is coupled to the wordline decoder and the match circuit and configured to selectively activate one of the wordline decoder and the match circuit by the control signal. Advantages of the invention include improved row redundancy for wordline replacement and block replacement.

30 Claims, 14 Drawing Sheets

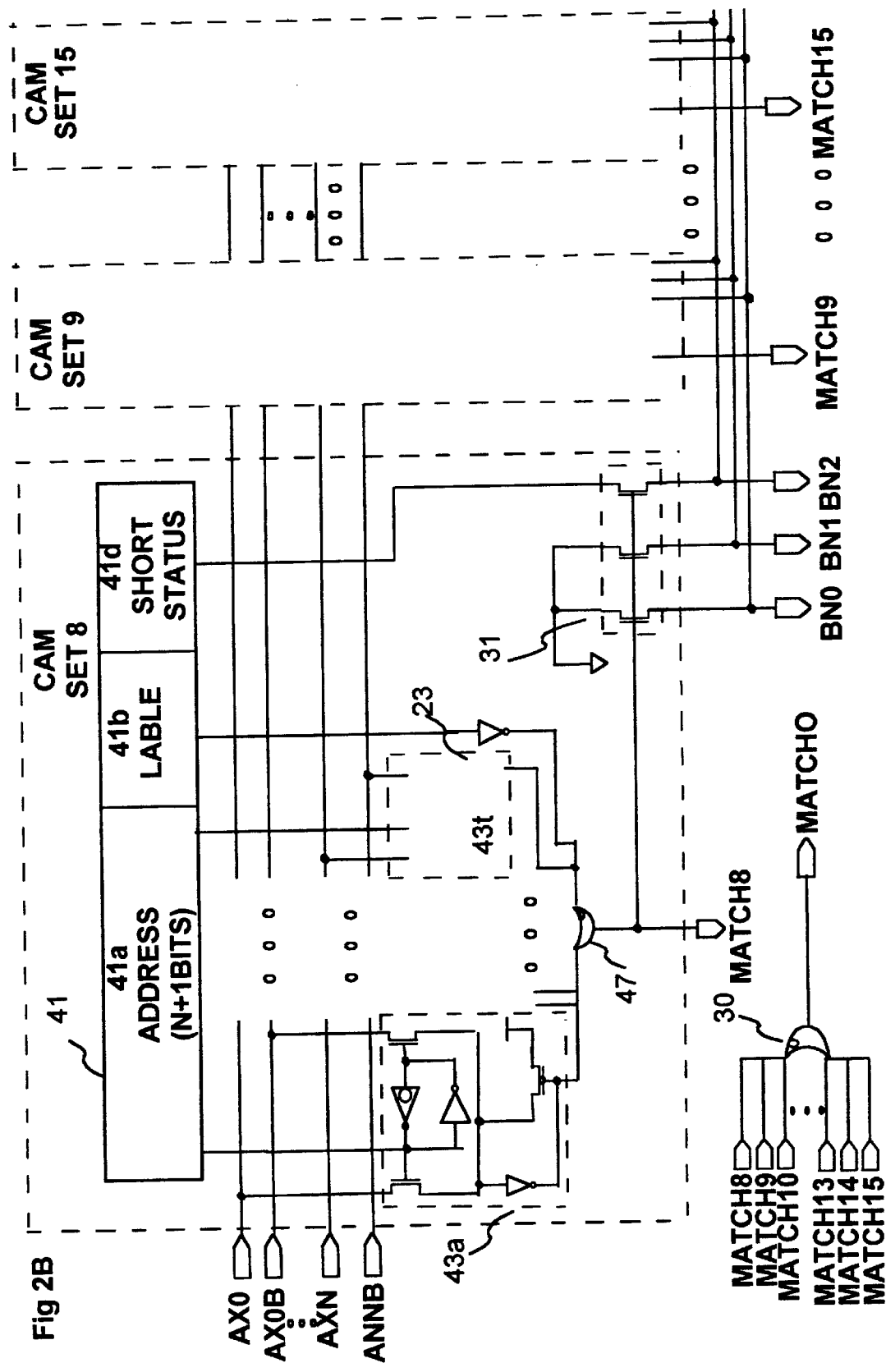

FLASH MEMORY WITH ROW REDUNDANCY

RELATED APPLICATIONS

This is a continuation in part of U.S. patent application Ser. No. 08/624,322 filed on Mar. 29, 1996, U.S. Pat. No. 5,646,890; U.S. patent application Ser. No. 08/645,630 filed on May 14, 1996, U.S. Pat. No. 5,687,121; U.S. patent application Ser. No. 08/664,639 filed on Jun. 17, 1996, pending; U.S. patent application Ser. No. 08/676,066 filed on Jul. 5, 1996, pending; and U.S. patent application Ser. No. 08/691,281 filed on Aug. 1, 1996, pending. These applications are incorporated herein by reference.

FIELD

The present invention relates to a flash memory with row redundancy. In particular, the flash memory includes a redundant memory structure to insure proper data storage and improve storage quality.

BACKGROUND

A traditional flash memory is formed by rows and columns of flash transistors. Wordlines couple the gates of the transistors in a row and bitlines couple the drains of transistors in a column while the sources of the transistors are typically coupled to a common sourceline. Often the transistors are grouped into blocks and the memory controller has control over the blocks. For example, a wordline decoder, bitline decoder and sourceline decoder can be configured to selectively activate a particular memory block at a time and to select an individual wordline in the block.

With reduced memory sizes, the chance of a memory error is increased. For example, small memory sizes are difficult to manufacture and may result in shorted wordlines or faulty memory cells. To alleviate the errors, redundant circuits are often built into memories. However, known memories with redundant structures are complex and require a significant amount of control both internal to the memory and external to the memory.

One type of known redundant memory assumes that the dominant failure mode for rows is shorting between two wordlines. (See U.S. Pat. Nos. 5,233,559 and 5,377,147). This technique preprograms every two adjacent wordlines before an erase. Because the current consumption of the double row program is twice that of a single row program, the bitline current supply may not be able to sustain sufficient current to achieve an effective program, and the program time will be longer. As a result, the technique is not efficient and the replaced cells may have a lower voltage threshold that the normal cells and cause overerase problems. Moreover, the technique does not account for other types of defective wordlines such as faulty memory cells or three or more faulty rows in a block.

Another type of known redundant memory provides block replacement of memory when a bad wordline is detected. The defective memory block is erase inhibited during the erase procedures to avoid overerase in the defective block. This technique is not efficient and provides no mechanism to support an erase inhibit on a row by row basis.

What is needed is a memory with a redundant structure that reduces the complexity of the controller and permits the efficient replacement of defective wordlines with redundant wordlines and defective blocks with redundant blocks. This is the subject matter of the invention.

SUMMARY

The invention provides a flash memory with row redundancy. The memory includes an input terminal to receive an address and a command signal. A plurality of flash memory arrays are arranged as blocks, where each block includes a plurality of transistors organized in rows and columns and having respective wordlines, bitlines and a sourceline. A wordline decoder is coupled to the input terminal and a portion of the plurality of blocks and configured to decode a portion of the address and to receive a control signal to selectively apply a predetermined voltage to a wordline. A bitline decoder is coupled to the input terminal and to the plurality of blocks and configured to decode a portion of the address and to selectively pass a predetermined bitline to an output terminal. A match circuit is coupled to the input terminal and to a portion of the plurality of blocks and configured to decode a portion of the address and to receive the control signal to selectively apply a predetermined voltage to a wordline. A control circuit is coupled to the wordline decoder and the match circuit and configured to selectively activate one of the wordline decoder and the match circuit by the control signal.

The exemplary embodiments can be combined with a voltage pump generator. A voltage pump generator provides operational voltages that are derived from the supplied voltages. For example, if the memory is supplied with 1.5V, and needs +10V for a program function, the voltage pump generator creates the required voltage and provides it to the decoder circuits to accomplish the necessary function. Likewise, the voltage pump can provide a negative voltage to the decoder circuits for the program function.

Advantages of the invention include improved row redundancy for wordline replacement and block replacement.

BRIEF DESCRIPTION OF THE FIGURES

Additional advantages of the invention will become apparent upon reading the following detailed description and upon reference to the figures, in which:

FIGS. 2A–2B depict a match circuit according to an embodiment of the invention;

DETAILED DESCRIPTION

Exemplary embodiments are described with reference to specific configurations. Those skilled in the art will appreciate that various changes and modifications can be made while remaining within the scope of the claims. For example, the invention can be used with any type of flash memory using Fowler-Nordheim (F-N) and channel hot electron (CHE) for erase and programming. All electrical parameters are given by example and can be modified with good results. For example, in the exemplary embodiments, a supply voltage (VDD) is considered as 5V, but could alternatively be 3V, 1.5V or other supply voltage. If a different supply voltage is chosen, the various operational voltage levels would be modified to reflect the different supply voltage.

FLASH MEMORY ARCHITECTURE

Figure 1:
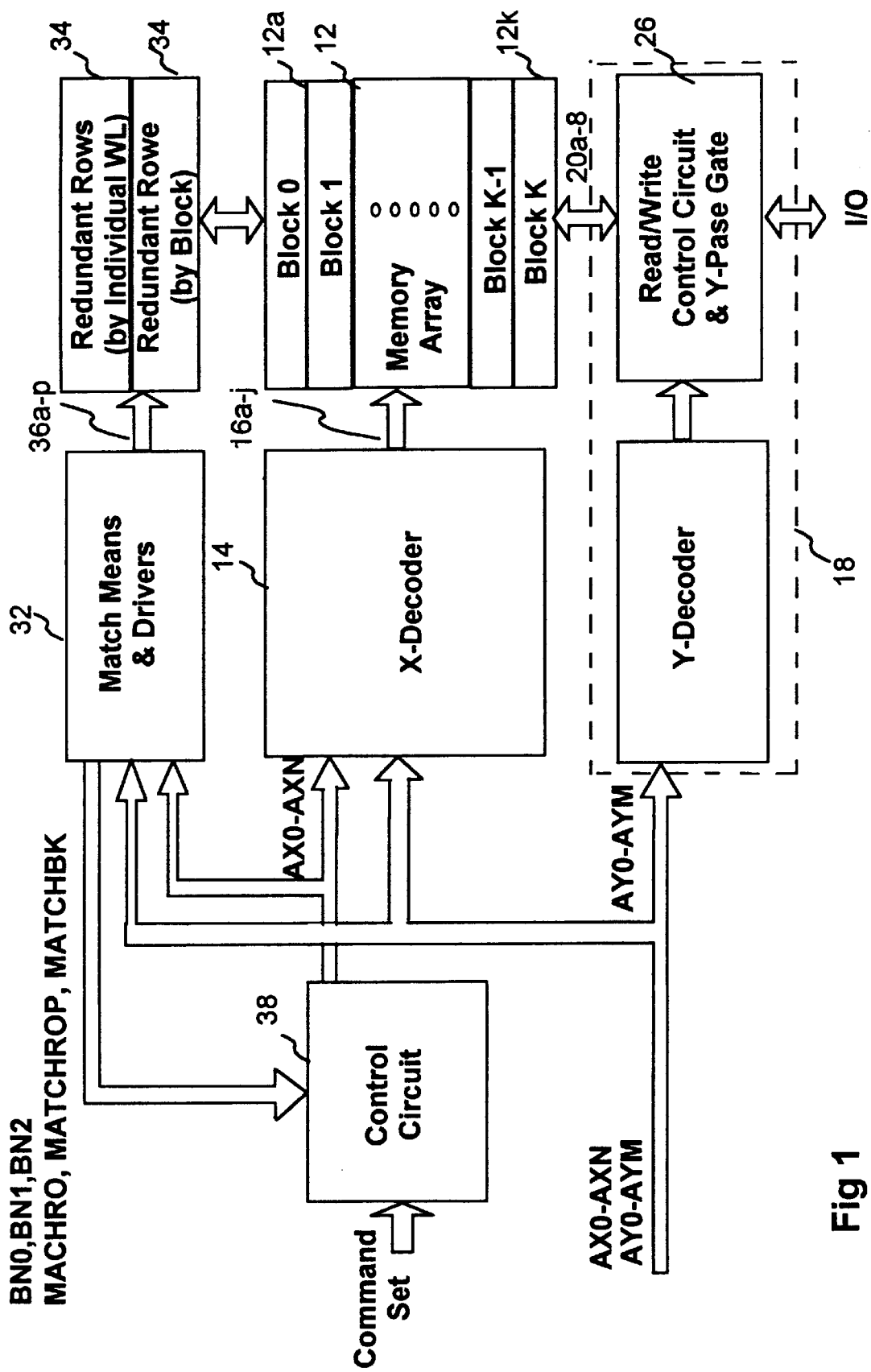
FIG. 1 depicts a multi-block flash memory incorporating an embodiment of the invention.

FIG. 1 depicts a multi-block flash memory 10 incorporating an embodiment of the invention. Flash memory 10 includes a plurality of blocks 12a–k that store information. Each block is constructed similar to a traditional flash transistors array with rows and columns of flash transistors configured in a NOR-plane. Alternately, other transistor configurations can be used such as a AND-plane.

A wordline decoder 14 is coupled to each of the blocks 12a–k. The number of blocks can be any number such as 32, 64 or more. Wordline decoder 14 receives an address input AX0-AXN and decodes the AX0-AXN input to activate a wordline 16a–j. The number of wordlines 16a–j depends on the number of address lines AX0-AXN, for example, 10 address lines can select from 1024 wordlines. When wordline decoder 14 is addressed by address input AX0-AXN, a corresponding wordline 16a–j is selected.

A match circuit 32 is coupled to a redundant memory structure having a plurality of wordlines 36a–p including redundant wordlines 34a and redundant blocks 34b. The number of redundant wordlines and blocks can be any number such as 4, 8 or more. Match circuit 32 receives the address input AX0-AXN and decodes the AX0-AXN input to determine whether the addressed wordline in the blocks 12a–k is valid or defective. If the addressed wordline is valid, the match circuit is dormant. However, if the addressed wordline is defective, the match circuit provides a signal to a control circuit 38 to disable wordline decoder 14. Then, the match circuit activates a redundant wordline 36a–p to provide the stored data.

A bitline decoder 18 is coupled to each of the blocks 12a–k and 34a–b. Bitline decoder 18 receives an address input AY0-AYM and decodes the AY0-AYM input to couple selected bitlines 20a–q from a selected block to read/write controller 26. Ordinarily, each bitline (e.g., 20a) includes a plurality of bitlines (BL0-BLr) where r represents a stored word that is usually 8 bits, 16 bits, 32 bits or other number of bits that represents a word to a processor. The number of bitlines 20a–q depends on the number of address lines AY0-AYM, for example, 8 address lines can select from 256 bitlines. When bitline decoder 18 is addressed by address input AY0-AYM, a corresponding bitline 20a–q is selected.

Both wordline decoder 14 and bitline decoder 18 are provided with the operational voltages VPN, VSS, VDD, VPP, VPI and others if necessary. In order to read, program and erase the memory, the voltages are selectively applied to selected flash memory cells as described below.

MATCH CIRCUIT

When the memory 10 is addressed, the match circuit 32 receives the same address portion as the wordline decoder 14, AX0-AXN. The match circuit 32 determines whether the addressed portion of memory is defective. If so, the match circuit 32 disables the wordline decoder 14 and enables a wordline driver that provides operational voltages to a redundant portion of memory. In order to determine whether to disable the wordline decoder 14, the match circuit performs an address lookup function. If the address is identified as defective, the match circuit 32 provides a signal to a control circuit 38, which disables the wordline decoder 14. The signals generated by the match circuit 32 and transmitted to the control circuit 38 include BN0, BN1, BN2, MATCHRO, MATCHROP and MATCHBK. The control circuit 38 decodes these signals to determine whether to enable or disable the wordline decoder 14.

Figure 2A:
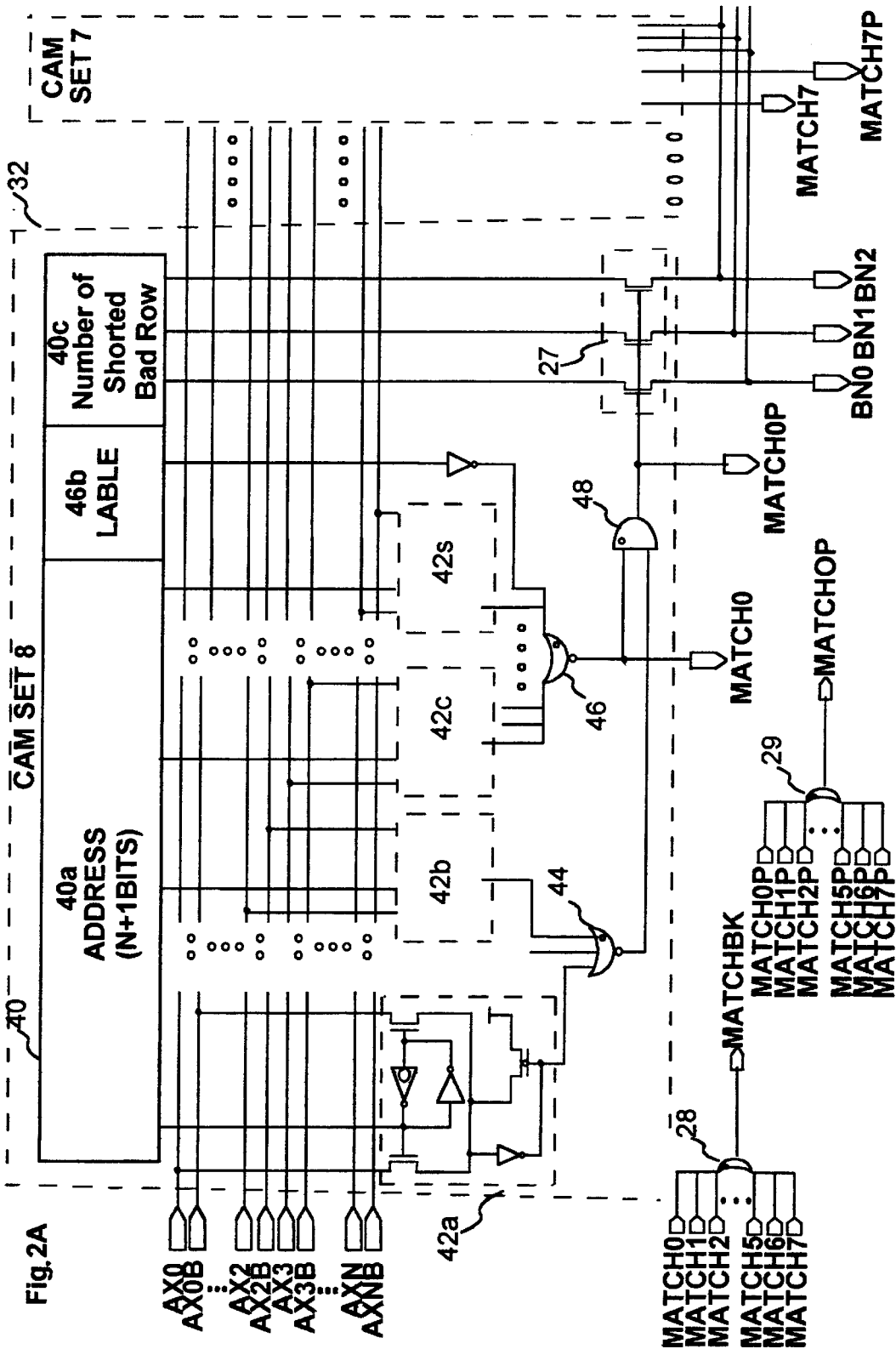

FIGS. 2A–E depict a match circuit 32 according to an embodiment of the invention. FIG. 2A depicts the match circuit for the defective block and FIG. 2B depicts the match circuit for the individual defective row. A content addressable memory (CAM) 40 contains an address portion 40a for storing a defective address (N+1 bits), a label 40b for storing the status of the CAM, a bad row portion 40c for storing the number of defective wordlines, and a short status portion 40d for indicating whether the shorted rows extend into the adjacent block.

When an address AX0-AXN is provided to the match circuit 32, the address is compared against the defective addresses stored in the CAM 40. Comparison circuits 42a–s compare the address AX0-AXN to the CAM address in portion 40a. If a match is identified, the comparison circuits 42c–s generate a match signal MATCH0. Within each block that is identified as having a defective wordline, a portion of the CAM 40c identifies the number of defective wordlines in that block. If one of the match signals MATCH0 to MATCH7 is identified, it means that is a defective block. If one of the match signals MATCH8 to MATCH15 is identified, it means that is a defective row.

In the embodiments of the invention, the arrangement for the row redundancy can achieve efficient replacement of the wordlines. The optimum number of spare wordlines replaced simultaneously is determined from the trade-off between the area of penalty and the replacement efficiency. That is, the defective wordline may occur in many types like one row, two shorted rows in separated blocks, two shorted rows in same block, three shorted rows in separated blocks, three shorted rows in same block and so on. Therefore, this invention provides two kinds of spare wordlines to satisfy the different defective statuses of the bad wordlines. There are several redundant individual wordlines available for replacement of only one defective wordline in a block. Also, there are several redundant blocks available for the replacement of the block when there are many defective wordlines in a block.

For each defective block that has at least two defective wordlines, the CAM needs to store only one defective address. The label 40b stores the information to indicate whether the address of the CAM set is active or not. If the label indicates that the CAM set is active (logic 1), the AND gate 48 is responsive to the comparison logic 42a–s. However, if the label 40b indicates that the CAM set is inactive (logic 0), the AND gate 48 is forced to output logic low regardless of the input from the comparison logic 42a–s.

When the CAM set is active, the bad row portion 40c indicates to the control circuit 38 the number of shorted wordlines with two signals BN0 and BN1. The short status portion 40d (BN2) indicates whether there is a defect in an adjacent block. The bits BN0, BN1 and BN2 are transmitted on a common bus line that are shared by the different CAM sets since only one CAM set is active at one time. The comparison logic device 42a–s is provided to compare the defective address stored in the CAM with the current address. If a match occurs, the replacement signal MATCH0 is generated through NOR gate 46 and the replacement signal MATCH0P is generated through NOR gate 44 and AND gate 48. The collective match signal MATCHBK is generated from the replacement signals MATCH0 to MATCH 7 through the OR gate 28, while the collective match signal MATCHROP is generated from the replacement signals MATCH0P to MATCH7P through the OR gate 29.

In the same manner, the match circuit for the individual defective row has a CAM 41 with an address portion 41a, a label portion 41b and a short status portion 41d, but not a third portion as in the CAM 40 (40c). The bits BN0 and BN1 are pulled to ground level (VSS, 0V) when a match occurs. The short status portion 40d (BN2) indicates whether there is a defect in an adjacent block. A comparison logic device 43a–t is provided to compare the defective address stored in the CAM with the current address. If a match occurs, the replacement signal MATCH8 is generated through NOR gate 47 and the collective match signal MATCHRO is generated from the replacement signals MATCH8 to MATCH15 through the OR gate 30.

EMBODIMENT A

1. Architecture

Figure 3:
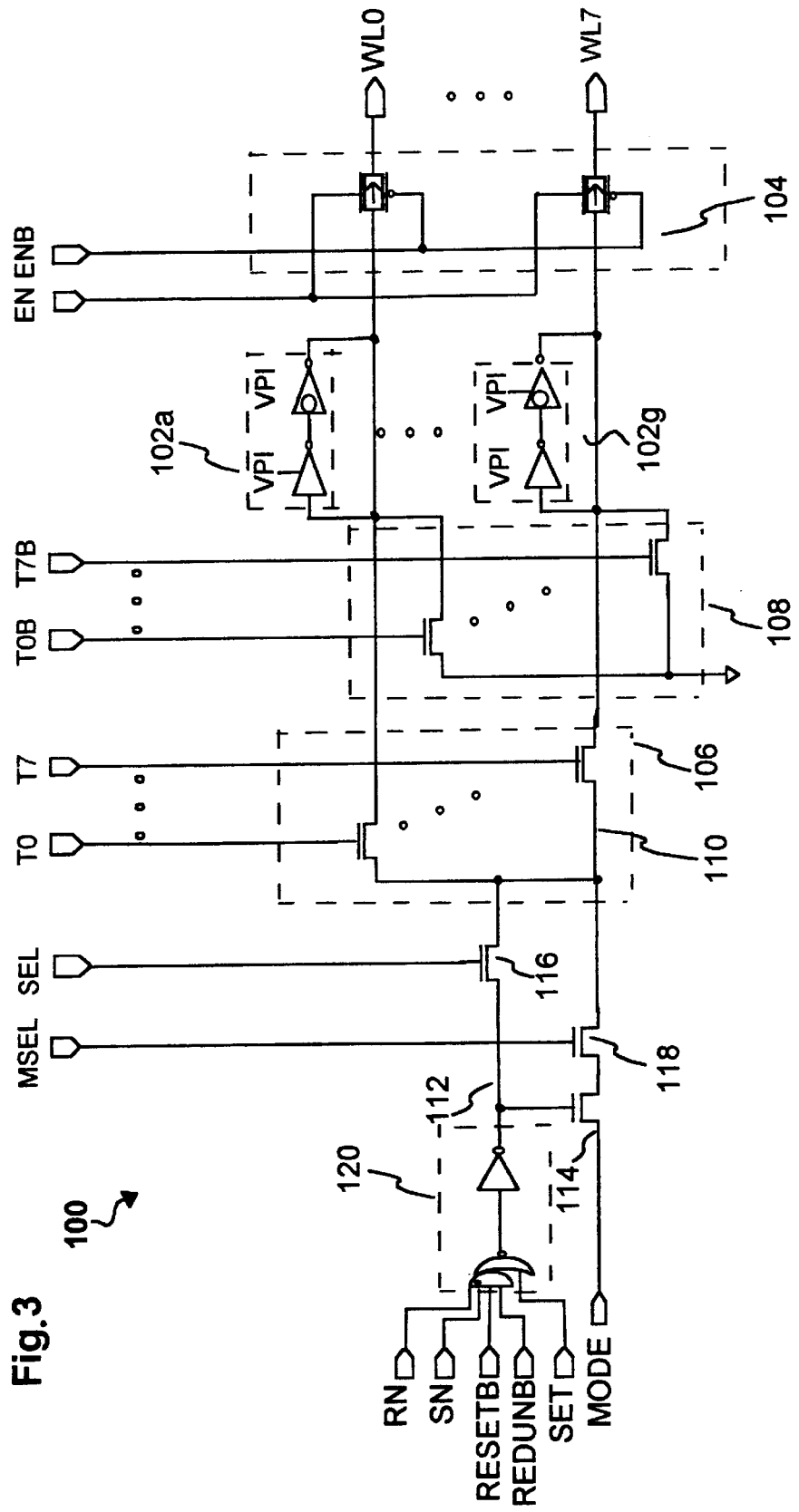
FIG. 3 depicts a regular WL driver according to an embodiment of the invention.

FIG. 3 depicts a regular WL driver 100 according to an embodiment of the invention. This particular WL driver 100 is designed for use with high voltage source erasure and with eight wordlines WL0–WL7 per block. The driver is selected by a number of signals. The signals RN and SN address the block of memory based on most significant bits (MSB) of the address AX0-AXN, which represents the first stage of the wordline decoder 14. The signals T0–T7 represent least significant bits (LSB) of the address, which serve to identify the specific wordline and control the second stage of the wordline decoder 14. The signals T0B–T7B are the inverse of signals T0–T7. The MODE, MSEL, SEL, EN and ENB signals are activated upon selection of the WL driver 100 and are discussed below.

The wordline driver 100 includes a latch 102a–g for each respective wordline. There is also a transmission gate coupled between the latches 102a–g and the wordlines WL0–WL7. Each latch 102a–g is coupled to a respective second stage of the WL decoder 106 and 108 that is controlled by the signals T0–T7 and T0B–T7B. The common line 110 determines the value to be set in latches 102a–g upon selection of the wordlines. The signal on the line 110 is determined by the signal on line 112, MODE, MSEL and SEL through the transistors 114, 116, 118 and 120. Since the input signals RN, SN, RESETB, REDUNB and SET applied to the first stage of the wordlines decoder also include the MODE signal, each WL can be latched to a specific voltage for different predetermined procedures. There are three major procedures for the flash memory and they are read, program and erase. Each of these procedures is described below with reference to the WL driver structure.

Figure 4:
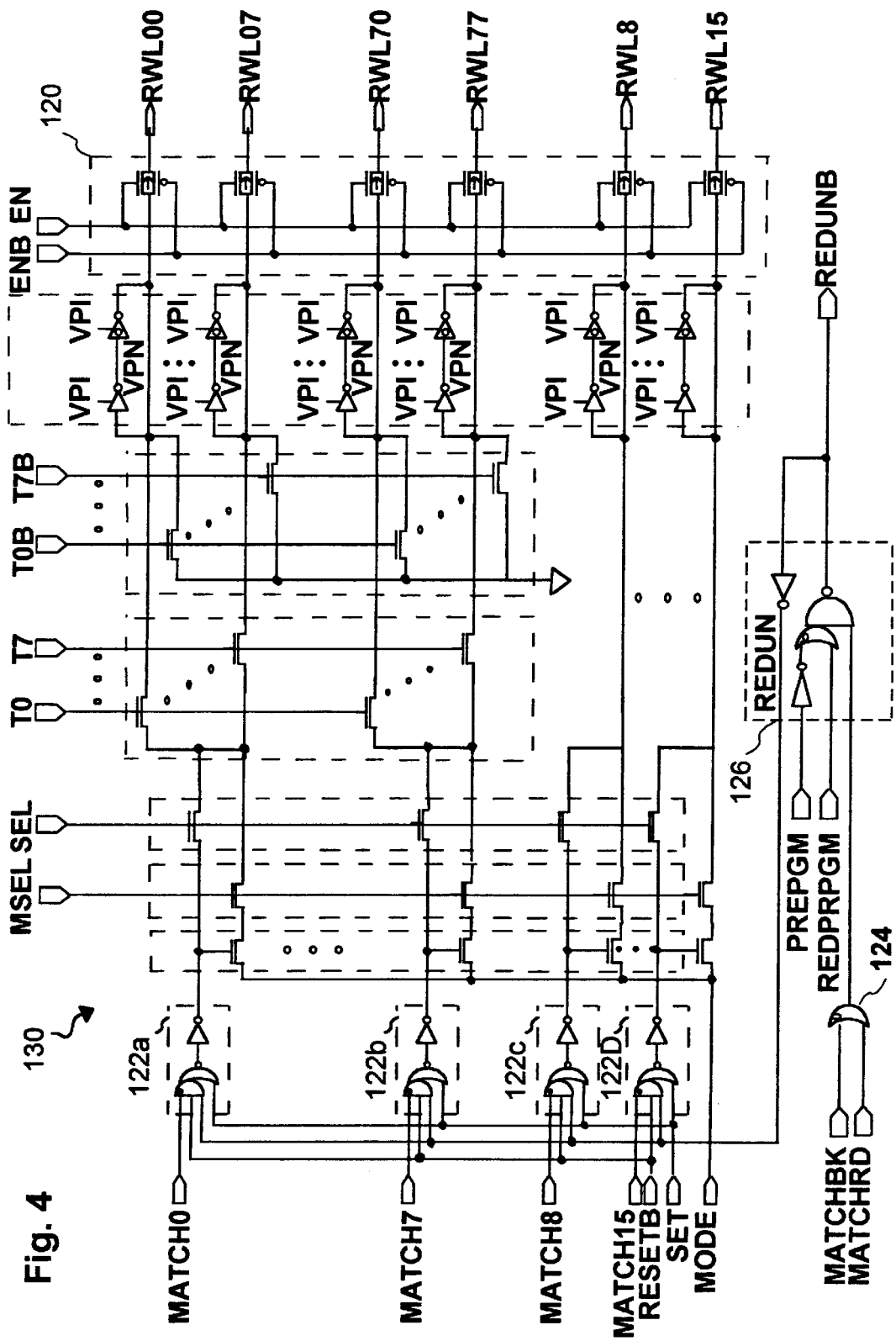
FIG. 4 depicts a redundant WL driver according to an embodiment of the invention.

FIG. 4 depicts a redundant WL driver 130 according to an embodiment of the invention. The WL driver 100 and the redundant WL driver 130 are similar in many respects and that same reference numerals are used to reference similar structures. The primary difference between the WL driver 100 and the redundant WL driver 130 is the first stage decoder. In the WL driver 100, the first stage decoder reflects the MSB of the address AX0-AXN as signals RN and SN. In the redundant wordline driver 130, the first stage decoder reflect the match circuit signals MATCH0-MATCH15. Both WL drivers receive the signals RESETB, SET, MODE, MSEL, SEL, EN, ENB, T0–T7 and T0B–T7B.

The signals are generated according to Table 1 based on the address input and the respective CAM set contents.

TABLE 1

| | BN1, BN0 | BN2 | MATCHRO | MATCHROP | MATCHBK |
|---|---|---|---|---|---|
| good row | 0 | 0 | 0 | 0 | 0 |
| defective row & not extending into the adjacent block | 0 | 0 | 1 | 0 | 0 |
| defective row & extending into the adjacent block | 0 | 1 | 1 | 0 | 0 |
| defective block & not extending into the adjacent block | 1, 2, 3 | 0 | 0 | 1 | 1 |
| defective block & extending into the adjacent block | 1, 2, 3 | 1 | 0 | 1 | 1 |

2. Read Procedure

In the read procedure, the memory is addressed by address signals AX0-AXN and AY0-AYM, which are branched to respective decoders 14 and 18. The address signals AX0-AXN are also branched to the match circuit 32. For the read procedure, the input signals RESETB is inactive (logic 1) and SET is inactive (logic 0) and the transmission gate 104 is enabled. If the wordlines in the addressed block are not defective, the REDUNB signal is also inactive (logic 1). The RN and SN signals are precoded from the MSB of the address AX0-AXN to identify the block. As a result, the addressed block receives a logic 1 signal on line 112. The signal SEL is active, and thus the transistor 116 passes the logic 1 signal from line 112 to line 110. The signal MSEL is held at logic 0 so that the MODE signal is prevented from passing through transistor 118. The second stage wordline decoder 106, 108 is controlled by LSB address signals T0–T7 and T0B–T7B to pass the signal on line 110 to the selected wordline WL0–WL7. Only the selected wordline receives a logic 1 signal, and the other wordlines receive a logic 0 signal. The selected cell will have a logic 1 voltage (VDD, +5V) applied to the gate, a logic 0 (ground) applied to the source and a pull up voltage applied to the bitline (drain) to detect whether the cell is passing current at the gated voltage. The presence or absence of current is detected by the read-write control circuit 26 and converted to data.

If the selected wordline is defective, the match circuit will identify the defective wordline in the CAM set and a replacement wordline will be activated. In that case, the match circuit will generate affirmative signals MATCHRO, MATCHROP, BN0, BN1, BN2 and MATCHBK. The controller circuit will assert the REDUNB signal to the selected WL driver 100 in the wordline decoder 14 to disable the wordline decoder 14 from applying a signal on the selected wordline. The match circuit 32 will then apply a wordline voltage to a redundant wordline using the signals MATCH0-MATCH15 to take the place of the defective wordline.

3. Program Procedure

Selection of the memory cells for the program procedure is similar to that of the read procedure. The cells are selected by the address AX0-AXN, AY0-AYM and the CAM set. However, the voltages applied to the memory cells for a program are quite different. As in a conventional flash memory CHE (channel hot electron) injection technique, VSS (0V) is applied to the source, positive voltage (+5V) is applied to the drain and high voltage (VPP, +12V) is applied to the gate. To achieve such a high voltage application on the selected wordline, the latch 102a–g is set for the selected wordline and then the input voltage to the latch (VPI) is increased until the desired voltage level is met. The bias condition causes an avalanche breakdown to occur in the vicinity of the drain at a predetermined period. The result is injected hot electrons to the floating gate. The stored negative charge in the floating gate makes the threshold voltage higher than the WL voltage supplied with the assumed read VDD level.

4. Erase Procedure

The erase procedure is more complex than the read and program procedures. This embodiment is erased by performing a preprogram procedure and then the erase procedure. The invention is capable of performing a single wordline erase, a multiple wordline erase and a whole memory erase as described below.

Figure 5:
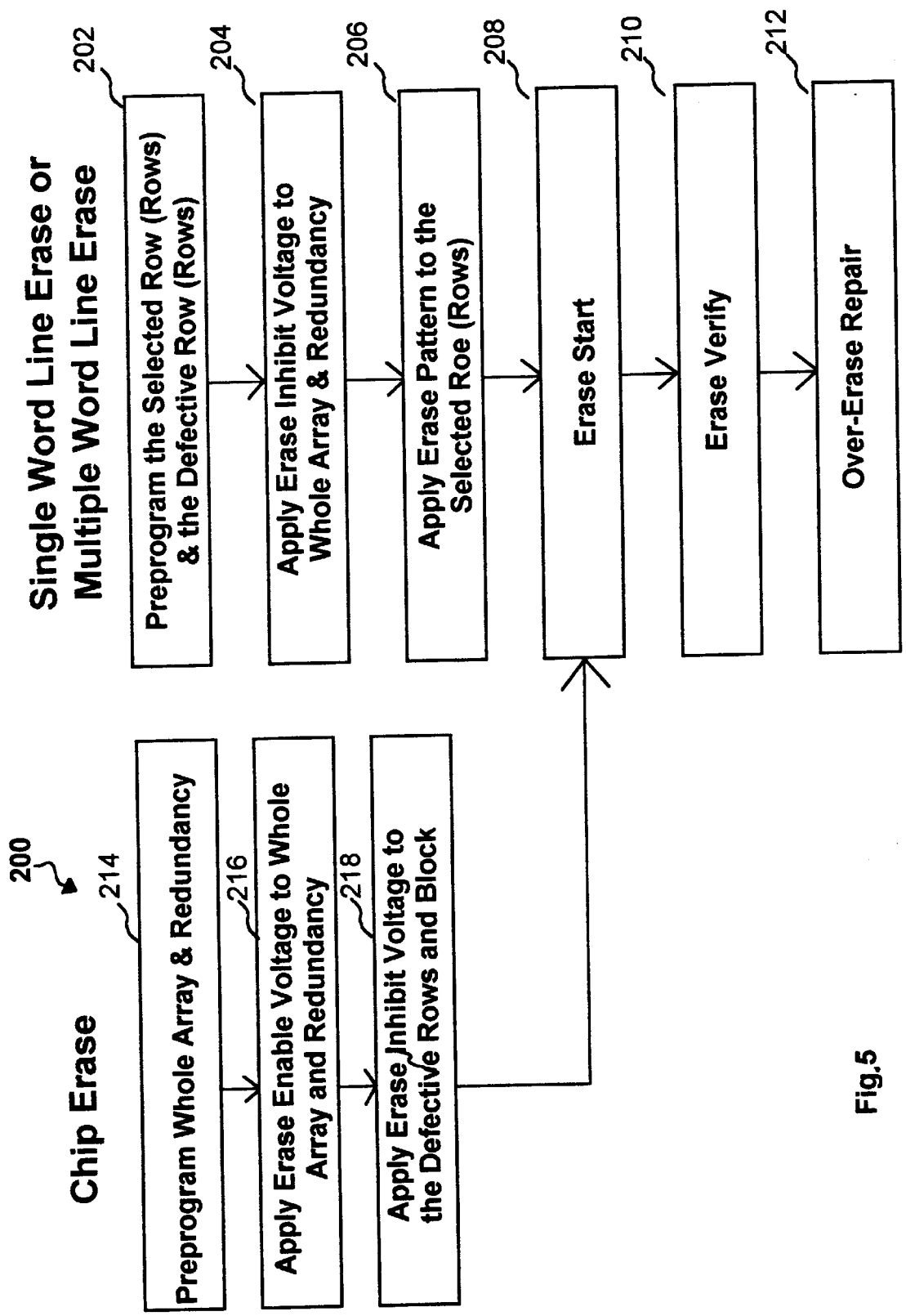
FIG. 5 is a flowchart showing different types of erase procedures according to an embodiment of the invention.

FIG. 5 is a flowchart 200 showing different types of erase procedures according to an embodiment of the invention. A single or multiple wordline erase procedure begins with step 202. Step 202 is performed by preprogramming the selected row or rows and the defective row or rows. Setting up the preprogram is complicated since the defective wordlines must be preprogrammed too. A scanning procedure is described below with reference to the flowchart of FIGS. 6A–B in order to preprogram the defective wordlines and the redundant wordlines. Once the preprogram of the selected cells is complete, step 204 applies an erase inhibit to the unselected wordlines according to the Flowchart of FIG. 7. In step 206 the erase pattern is applied to the selected wordlines. In step 208 the erase voltages are applied to the selected cells. In step 210 the selected cells are read to verify their erase condition. In step 212 any overerased cells are repaired.

A preprogram of the whole memory begins with step 214. Step 214 is performed by preprogramming the whole memory including the redundant memory. Step 216 applies an erase enable voltage to the whole memory. Step 218 is performed by applying an erase inhibit to the defective wordlines and blocks. This procedure is clarified in the flowchart of FIG. 7 described below. Thereafter, the procedure is similar to that described above and executes steps 208, 210 and 212.

Figure 6A:
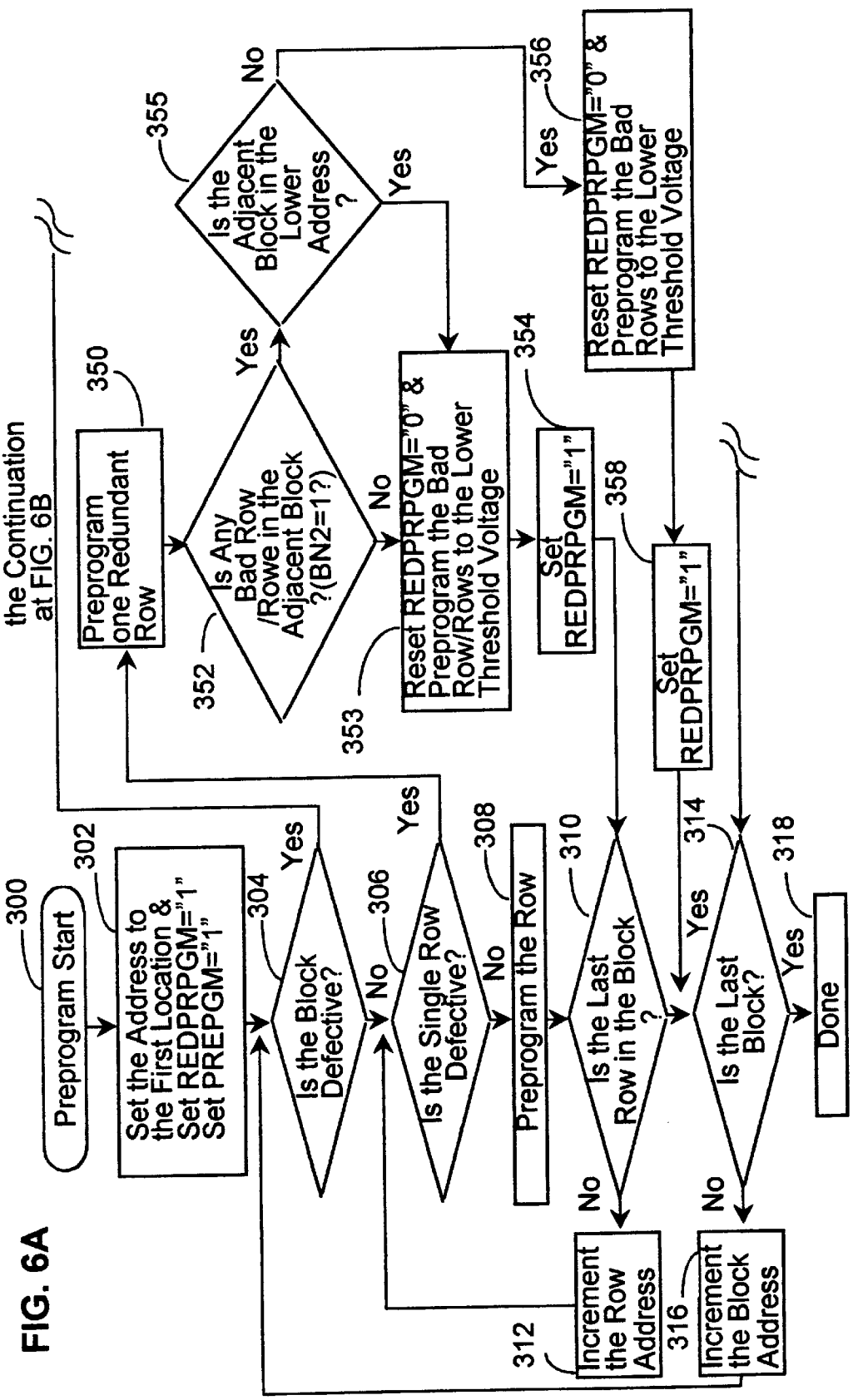
FIGS. 6A–6B are a flowchart showing the steps for preprogram according to an embodiment of the invention.
Figure 6B:
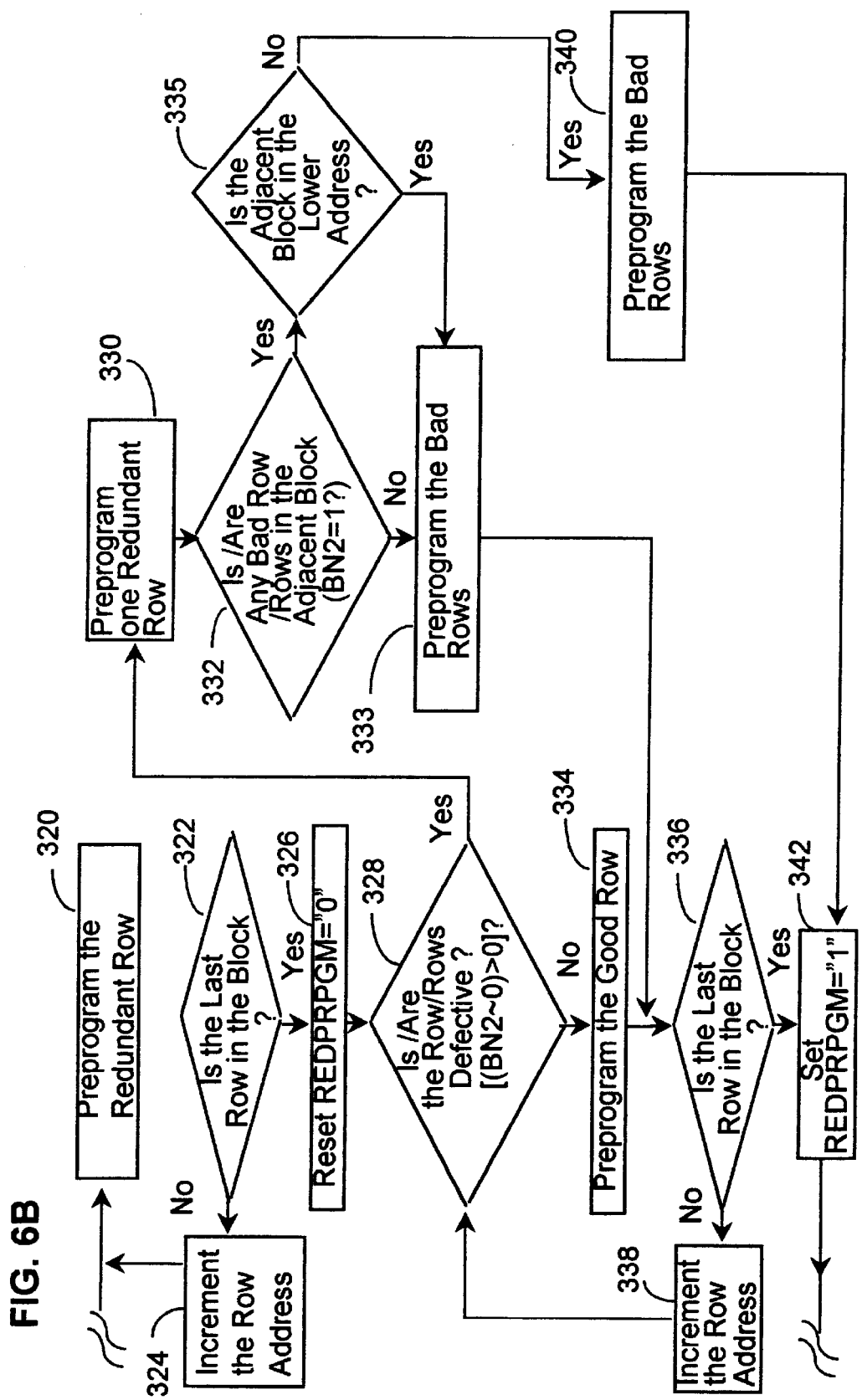

FIGS. 6A–B show a flowchart for the steps of preprogramming the memory according to an embodiment of the invention. Before starting to actually erase the memory, a preprogram operation is useful to insure that all the memory cell thresholds are substantially uniform. FIGS. 6A–B show a combined flow chart of preprogram operation before chip erase. The starting step 300 is first performed when the memory receives a command from an external structure. The procedure then moves to step 302 by setting the incoming address to the first location and by setting the signal REDPRPGM to logic 1 (VDD) level and PREPGM to logic 1. Referring to FIG. 4, by setting PREPGM to logic 1, the REDPRGM signal is the one that controls the OR gate in the logic 126. If the signal REDPRPGM is logic 1 during preprogram operation, that will indicate that the preprogram is for the redundant wordline or block if there is a match but not the defective wordline or block. Similarly, if the signal REDPRGM is logic 0 the signal REDUNB is forced to logic 1 thereby enabling the primary blocks even if there is a match. This allows the REDUNB signal to provide programming control over the redundant blocks and the defective blocks in the primary blocks.

After the set operation, decision step 304 is performed. If the checked block is good, decision step 306 is performed respectively. Step 306 is performed to determine whether the wordline is defective. If not, step 308 programs the wordline and then step 310 determines whether the last wordline in the block is programmed. If there are still wordlines to program in the block, step 310 passes the processing to step 312 which increments the wordline address and returns the processing to step 306 in order to program all the wordlines. If there are no more wordlines in the block, step 310 passes the processing to step 314 to determine whether the last block is programmed. If there are still blocks to program, step 314 passes the processing to step 316 which increments the block address and returns the processing to step 304 in order to program all the blocks. Once all the blocks are programmed, step 314 passes the procedure to step 318 to end the preprogram procedure.

When step 304 determines that the block is defective, a procedure is performed to preprogram a redundant block. Step 320 is performed to program the first wordline in the redundant block. Step 322 determines whether the wordline is the last in the block. If not, then step 324 increments the wordline and passes the procedure to step 320 to program the incremented wordline. Once all the wordlines are programmed, step 322 passes the procedure to step 326, which resets the REDPRGM signal to logic 0. Step 328 returns to the defective block to program that block.

Step 328 determines whether multiple wordlines in the defective block are defective by reading the number of bad wordlines from the CAM set. This is determined by checking whether the bits BN2, BN1, BN0 are greater than 0. If the result shows the wordline itself or adjacent wordlines within same bad block are defective then the multi-selection program step 330 is performed. The setting for the multi-selection program is controlled by the control circuit 38. Note that the multi-selection program consumes several times the current of a single row program. It is ordinarily difficult to program the valid cells to a high threshold due to the limitation of the supplying current. U.S. Pat. No. 5,377,147 describes the extent to which traditional memories need to preprogram the cells in the shorted wordlines. These memories use special reference cells for the program verify and to prevent overerase. In the present invention, however, since the defective cells do not store any meaningful data, the defective rows need not be programmed to achieve the high threshold voltage of valid rows, but rather just high enough so that they will not turn on with a lowered verify voltage. Further, the invention provides wordline latches 102a–g that can be set to apply an erase inhibit voltage to the unselected and the defective rows so that the over-erased state will not occur on these rows. Therefore, the prevention from faulty voltage caused by many rows (more than two rows) shorted together is achieved by the unique latch type design of the WL driver 100 for either multi-selection program or verification. The number (BN0, BN1) of the bad rows not only indicates the matching address but also implies the addresses of the adjacent shorted wordlines. Meanwhile, the transmission gate 104 (refer to FIG. 3) is shut off to prevent latching the wrong state when the loading address decodes the wordline to the latched state caused by the shorted path. The control circuit 38 issues the address of the shorted wordlines by keeping the MSEL to logic high and turning on the corresponding signal from T0–T7 sequentially. Once the loading addresses for multiple selection operation are settled down, the transmission gate is changed into the on-state. If step 328 is negative, step 334 programs the good wordline. Then step 336 determines whether the wordline is the last in the block. If not, step 338 increments the wordline and passes the processing back to step 328 to continue to check the wordlines. Once step 336 determines that all the wordlines are checked, the procedure is passed to step 342.

Note that sometimes the shorted wordlines cross over two adjacent blocks, so the decision step 332 is performed. Step 332 determines whether any addresses of the bad wordlines belong to the adjacent block by checking bit BN2. If BN2 is logic 0, then there are no defective rows are in an adjacent block, while if BN2 is logic 1, then there are defective rows in an adjacent block. If there are no bad wordlines in the adjacent block, step 333 programs the defective rows in the present block. Often the defective cells are unable to achieve a high voltage threshold and the cells end up having a lower threshold voltage. This is generally fine as long as their threshold is above an overerased state so that the cell can be turned off with the applied low voltage (e.g. ground) during a read procedure. Step 333 then passes the procedure to step 336. If there are bad wordlines in the adjacent block, step 335 determines whether the bad block is in a low address. If yes, step 333 is performed. If not, step 340 programs the bad rows. This step is similar to step 333 and the bad cells may not achieve a high voltage threshold. Step 340 then passes the procedure to step 342. Step 342 sets the signal REDPRGM to logic 1 and returns the procedure to step 314 to check the next block.

When step 306 determines that the wordline is defective, step 350 is performed to preprogram a redundant wordline. Step 352 determines whether there is a defective wordline in the adjacent block by checking whether BN2 is logic 1. If not, step 353 resets REDPRGM to logic 0 to permit the defective wordline to be programmed. Then step 354 is performed to reset REDPRGM to logic 1, and to pass the procedure to step 310. If step 352 determines that there is a defective row in the adjacent block, step 355 determines whether the adjacent block is in a lower address. If so, step 355 passes the procedure to step 352. If not, step 355 passes the procedure to step 356 where REDPRGM is set to logic 0 to program the defective row. Once step 356 is complete, step 358 sets REDPRGM to logic 1 and the procedure is passed to step 314.

Thus, the preprogram procedure continues until the whole memory is properly programmed. As a result, the valid portions of memory, defective portions of memory and redundant portions of memory are all correctly preprogrammed.

Figure 7:
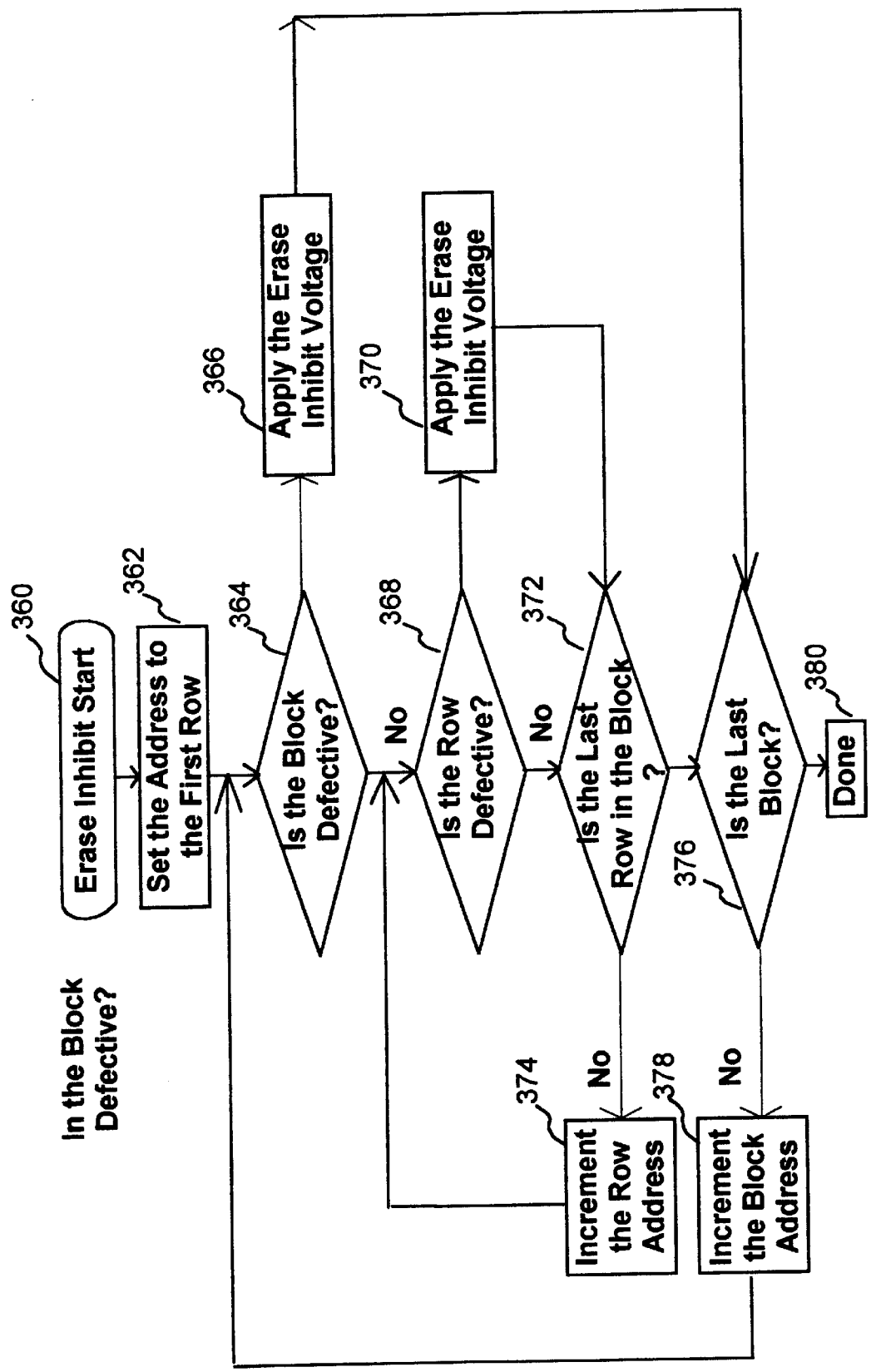
FIG. 7 is a flowchart showing the steps for scanning a defective row and block according to an embodiment of the invention.

FIG. 7 is a flowchart showing the steps for scanning defective wordlines and blocks in order to perform the erase inhibit steps 204 and 218 of FIG. 5. In step 360 the erase inhibit procedure begins. In step 362, the scan address is initialized to the first address. Step 364 determines whether the block is defective. If so, step 366 applies the erase inhibit voltage to all the WL driver latches 102a–g in the block. If not, step 368 determines whether the wordline is defective. If so, step 370 applies the erase inhibit voltage to the WL driver latch 102a–g for that selected wordline. Step 372 determines whether all the wordlines in the block have been checked. If not, step 374 increments the wordline address and passes the procedure back to step 368. If so, step 376 determines whether all the blocks have been checked. If not, step 378 increments the block address and passes the procedure back to step 364. When step 376 determines that all the blocks have been checked, step 380 completes the procedure.

Based on the flowchart description, the detailed operation of the WL driver 100 is now described. Referring to FIG. 3, while starting a single WL erase operation, the first step is to initiate all the rows, with the redundant rows included. The erase inhibit level is applied by enabling the signals SET, SEL, applying logic 1 to T0–T7 in a pulse manner, and by disabling MSEL and setting T0B–T7B to logic 0. The following step is to turn off the transistor 116 by applying VSS (ground) to SEL decoding the chosen row by RN, SN and T0–T7. T0B–T7B are kept at VSS (ground) throughout the erase operation. By raising MSEL to logic 1 to turn on the transistor 118, and then by setting MODE to logic 0, a selected latch is set to logic 0, which enables an erase wordline voltage. Once the latched setup is completed, the single wordline erase is activated by lowering the voltage on the latches set to logic 0.

The multiple wordline erase is similar as the single wordline erase procedure except that a plurality of wordline latches 102a–g are set to logic 0 to enable the erase procedure. If an entire block is to be erased, the best procedure is to activate the signals T0–T7 and MSEL to logic 1 simultaneously, rather than one wordline at a time.

When a whole chip erase is desired, it is initiated by a RESETB pulse to all the wordlines. For enabling all the second stage of the wordline decoder 106 and 108, T0–T7 are set to logic 1 and T0B–T7B are set to logic 0 respectively. The first stage of the wordline decoder 120 is also reset to logic 0 by RESETB. Active SEL couples line 112 and the wordline to logic 0. After the initiation, the next scanning procedure is proceeded by a sequencer controlled by the control circuit 38. Once the wordline (block) address matches the defective address stored in the CAM set, the erase inhibit voltage coming from MODE will be applied to the bad wordline (block) by activating MSEL, T0 (for example) and the output line 112. When the scanning is complete, the next enabling chip erase operation can be performed.

In FIG. 4, the WL driver 130 of the row redundancy is designed to replace the faulty rows or blocks. For the explanatory example, the eight WL drivers RWL00–RWL77 for the redundant blocks have the same structure as the regular WL driver 100. Additionally, the other eight WL drivers RWL8–RWL15 have almost the same configuration as the above redundant WL driver 130 except they may be constructed without the second stage of the wordline. Each redundant WL driver has its own matching address input from the CAM sets, the set and reset signals are also comprised to be the input of the first stage of the wordline 122. Basically, the operation is the same as the regular WL driver. If there is any matching signal either bad row or block, the NOR gate 124 and the glue logic 126 will bring out the disabling signal REDUNB to the memory array during non-preprogram operation. On the contrary, one of the redundant WL drivers will be enabled by REDUN. However, during the preprogram operation, the glue logic 126 is controlled by matching signals, of course, from NOR gate 124 and the signal REDPRPGM. The setting and the resetting operation of REDPRPGM is determined by the control circuit 38. Therefore, as shown and described, the defective rows (blocks) and the redundant rows (blocks) can be preprogrammed by this invention.

EMBODIMENT B

1. Architecture

Figure 8:
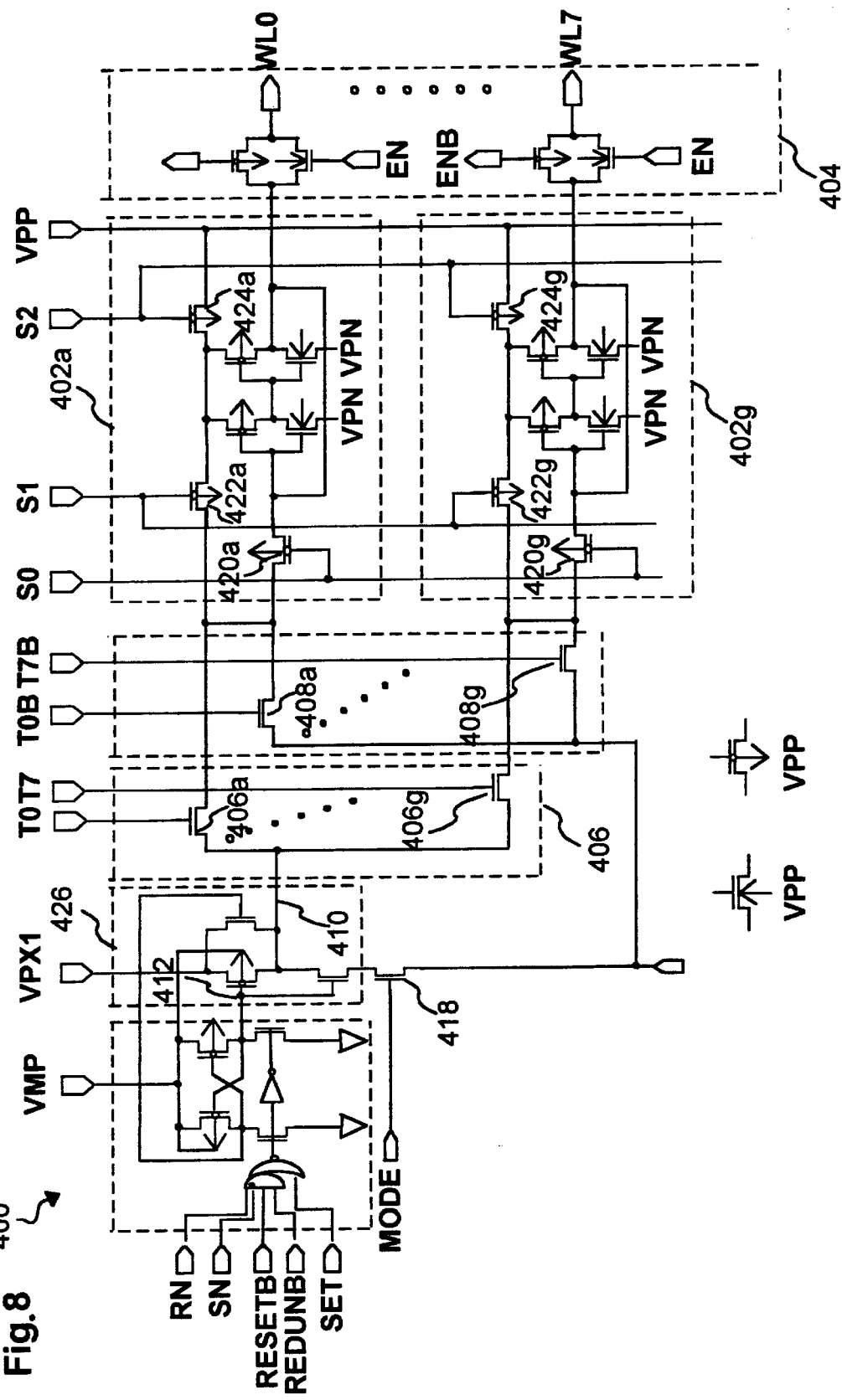
FIG. 8 depicts a regular WL driver according to an embodiment of the invention.

FIG. 8 depicts a regular WL driver 400 designed for a flash memory using a negative high voltage gate erasure technique. The WL driver 400 includes eight rows from WL0 to WL7 in a block. The WL driver 400 is selected by a number is signals similar to that of WL driver 100 and similar reference signal notation is used.

The wordline driver 400 includes a latch 402a–g for each respective wordline. Each latch 402a–g is coupled to a respective second stage of the WL decoder 106 and 108 that is controlled by the signals T0–T7 and T0B–T7B. The common line 410 determines the value to be set in latches 402a–g upon selection of the wordlines. The signal on line 410 is determined by the signal on line 412, MODE, VPX1 and VPX2. Since the input signals RN, SN, RESETB, REDUNB and SET are applied to the first stage of the wordline decoder, also included the VPX1 and VPX2 signals, each wordline can be latched to a specific voltage corresponding to different predetermined situation and based on signals S0, S1 and S2. There are three major operations for flash memory and they are read, program and erase. Each of these procedures is described below with reference to the WL driver structure.

Figure 9:
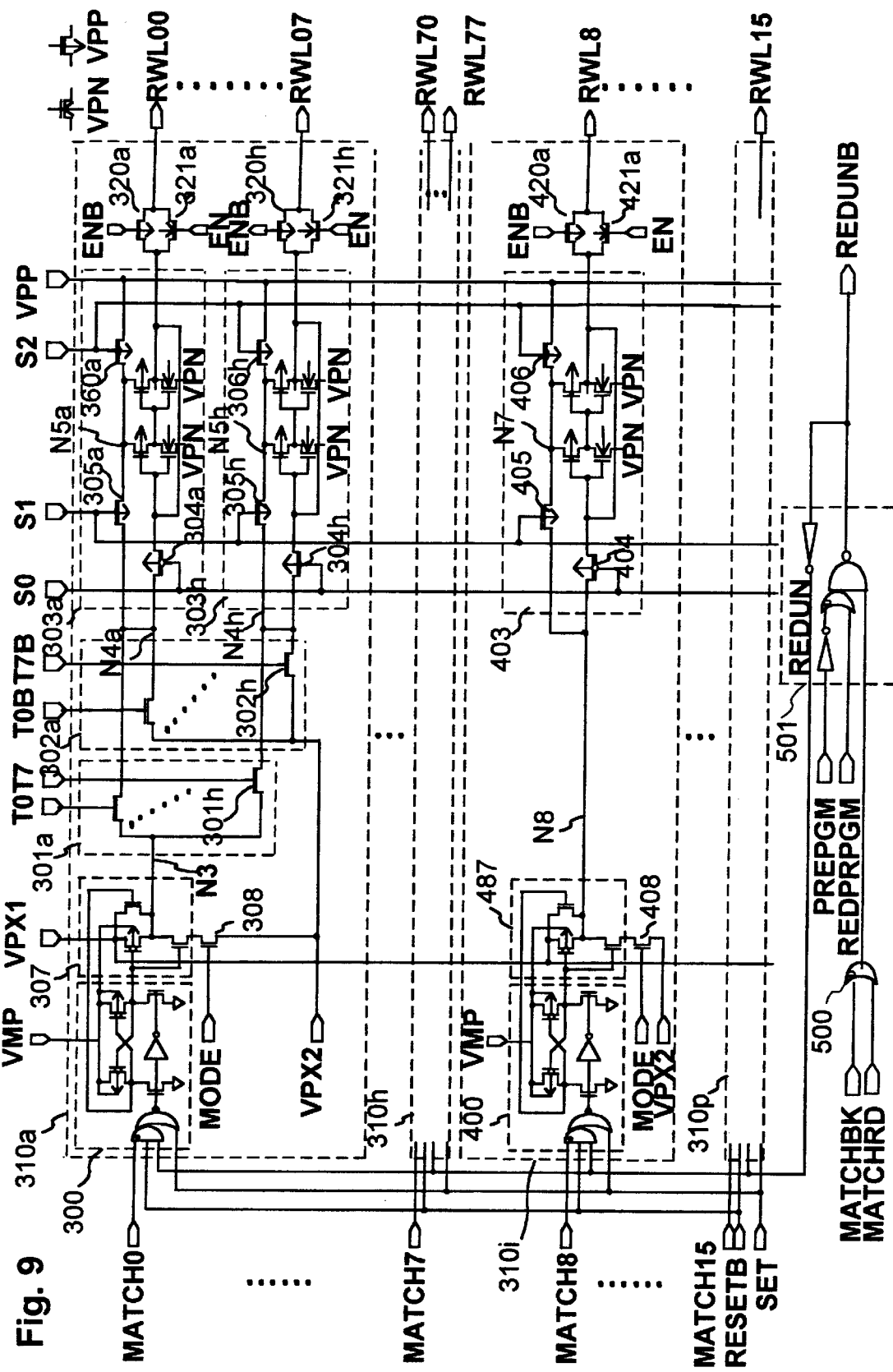
FIG. 9 depicts a redundant WL driver according to an embodiment of the invention.

FIG. 9 depicts a redundant WL driver 430 according to an embodiment of the invention. The WL driver 400 and the redundant WL driver 430 are similar in many respects and that same reference numerals are used to reference similar structures. The primary difference between the WL driver 400 and the redundant WL driver 430 is the first stage decoder. In the WL driver 400, the first stage decoder reflects the MSB of the address AX0-AXN as signals RN and SN. In the redundant wordline driver 430, the first stage decoder reflect the match circuit signals MATCH0–MATCH15. Both WL drivers receive the signals RESETB, SET, MODE, VPX1, VPX2, S0, S1, S2, T0–17 and T0B–T7B.

2. Read Procedure

In the read procedure, the memory is addressed by address signals AX0-AXN and AY0-AYM, which are branched to respective decoders 14 and 18. The address signals AX0-AXN are also branched to the match circuit 32. For the read procedure, the input signal RESETB is inactive (logic 1) and SET is inactive (logic 0) and the transmission gate 404 is enabled. If the rows in the addressed block are not defective, the REDUNB is also inactive (logic 1). The RN and SN signals are precoded from the MSB of the address AX0-AXN to identify the block. The MODE signal always keeps the transistor 418 on, which can pass the ground level from VPX2 during the read procedure. At the same time, the VPX1 signal is kept at the VDD (+5V) level so the second stage wordline decoder 406, 408 is controlled by LSB address signals T0–T7 and T0B–T7B. During read procedure the S0 signal is always kept at ground level so transistors 420a–g are on, the S2 signal is ground level so transistors 422a–g are off and S1 is VDD level so transistors 424a–g are on. When one wordline is selected by decoder stages 406, 408, the signal on line 410 is selectively passed to one of the latches 402a–g through the decoder stage 406 and through one of the transistors 420a–g, and thus the wordline is provided with the appropriate voltage to perform the read.

To better understand the present invention, one example is described below. While the selected block is given a VDD level to line 410, the unselected one is given a ground level to the other same logic line. Since the T0–T7 and T0B–T7B signals are complementary to each other, we can assume that the T0 is logic 1. The selected row WL0 is pulled up to VDD level through the line VPX1 and the other WL1–WL7 is pulled down by decoder 408. The unselected block has the same scheme as the above description except the ground level passes through transistor 418 to the unselected row. However, once the faulty row or block is detected, the REDUNB becomes active. Thus, the selected wordline is activated and each unselected block in memory array will be turned into an off state.

3. Program Procedure

The program procedure is similar to the read procedure. The wordline selection is the same and the main difference is that VPP signal level and S2 signal are ramped to a high voltage. The high voltage level depends on the type program scheme used. One conventional approach is a flash EEPROM drain side CHE (channel hot electron) injection, where the source is grounded (e.g. 0V), the drain receives a positive voltage (e.g. 5V) and the control gate receives a high voltage (e.g. 12V). The bias condition causes an avalanche breakdown to occur in the vicinity of the drain at predetermined period. Therefore, it results in the injection of the hot electrons to the floating gate. The stored negative charge in the floating gate makes the threshold voltage higher than the WL voltage supplied with the assumed VDD level.

Another approach uses source side CHE injection to program. The bias condition is different from the above drain side CHE injection. The voltage of the source and drain is just interchanged. However, the high voltage of the control gate is not changed.

A third approach uses the Fowler-Nordheim tunneling to program. This kind of program scheme requires a higher voltage than the drain (source) side CHE injection. The programmed data pattern is decided by the voltage of the bit line. Due to the electrical field between the control gate and the formed channel from the drain side to the source side, the higher electrical field will force negative charge into the floating gate. The invention can employ any of these or other techniques to program the memory.

4. Erase Procedure

Considering two techniques where one involves a negative high voltage gate erase and the other involves a positive high voltage source erase, both of the techniques use Fowler-Nordheim tunneling to eject negative charge stored in the floating gate. However, the latter develops a relatively high reverse voltage between the source region of the cell and the bulk substrate. Thus, the avalanche dominated conduction current can be up to a microamp or higher per cell. As a result, it is very difficult to provide enough current from an on-chip charge pump circuit and an external power supply (VPP, +12V) is desirable. Therefore, when using a single power supply for the flash memory, the former technique is preferred. Although the erase bias condition is different in each technique, the procedure for the erase operation is almost the same (see FIG. 12) except the preprogram operation is optional in the invention. This is because the unique design for the WL driver can supply three difference voltage levels during erase verify, over-erase verify and over-erase repair operation. (See U.S. Pat. Ser. No. 08/676,066).

As mentioned above, the preprogramming is necessary for the known memories due to over-erased cells not shutting off when repairing or verifying. Accordingly, the known memory circuits will conduct large currents leading to the lower repair efficiency or misidentify those not erased enough cells to an erased state. Therefore, known memory circuits must try to reduce the number of possible over-erased cells by preprogramming. However, the invention provides the feature that even the unselected over-erased cells can be truly shut off during erase verify, over-erase verify and over-erase repair operation so that the preprogramming is not required. (See U.S. Pat. Ser. No. 08/676, 066). Of course, a preprogram procedure is still anticipated by the invention.

Figure 10:
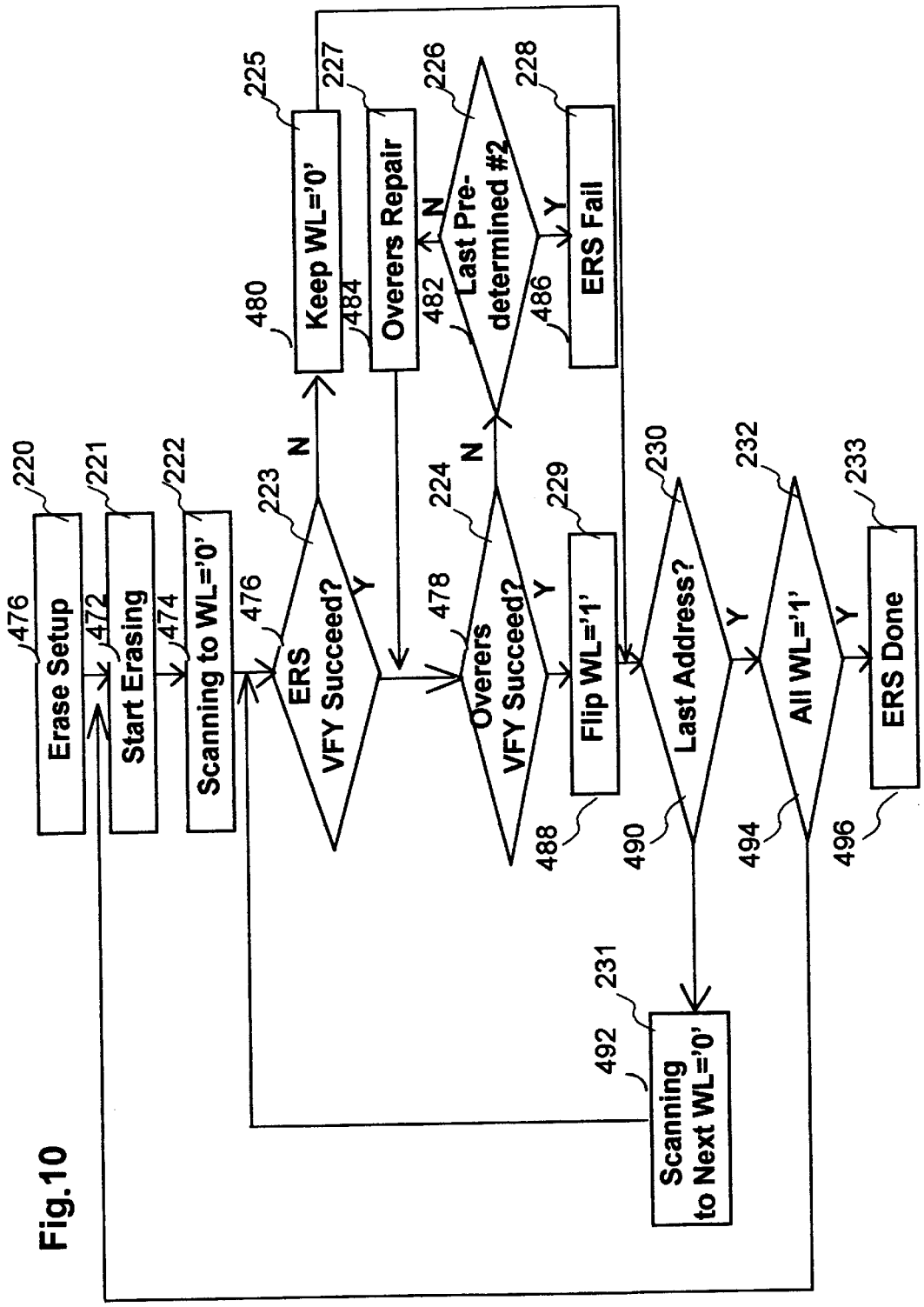
FIG. 10 is a flowchart showing the steps for erasing the memory according to an embodiment of the invention.

Before starting the erase operation without a preprogramming procedure, the erase inhibit voltage still needs to be applied to the control gate of the unselected cells and defective cells. It is called erase setup that is shown in the FIG. 5 steps 204, 206 and 216, 218. A flow chart for more details about the erasure is depicted in FIG. 10. An erase setup step 470 begins the procedure wherein the memory receives the erase command signal from an off-chip controller along with the address to be erased. First, the erase inhibit voltage is applied to all the regular blocks and to the redundant blocks. Once the erase inhibit is complete, the erase pattern is sent to the selected blocks one by one. After the block erase pattern is set then the erase pattern of the selected row is set one by one. Once all the erase patterns are latched in each selected blocks or rows, the erase step 472 is performed by pumping the selected wordlines to a negative high voltage level (e.g. −10V) and the bit lines to relatively high voltage level (e.g. +5V). After a predetermined period, the scanning step 474 is performed. The purpose of scanning for the selected rows is that the addresses of the multiple-selected wordlines are randomly distributed. Thus, the erased wordlines are found without storing the addresses in registers, or reloading the addresses from an off-chip controller. The state of each row can be read out by a sequencing the address by using a sequencer within control circuit 38 and attached to the address bus. Whenever the state of the wordline is logic 1, the sequencer skips to the next WL. Once the state of a wordline is found at the state logic 0, then the erase verify step 476 is performed. If all the cells' voltage thresholds (Vt) on the wordline are lower than the verified voltage (e.g. 1V), the next step over-erase verify block 478 is performed. If not, the step 480 is performed so that selected wordline is kept at low state for next erasure, and the procedure is then passed to step 490 described below.

Back to step 478, if any of the cells' Vt is lower than the verified voltage (e.g. 0.5V), step 482 determines whether the wordline has been checked a predetermined number of times. If not, a repair operation is performed in step 484. If step 482 is affirmative, then the erase fails in step 486. The predetermined number is selected to give the memory control circuit a chance to repair the overerase a number of times, but also to prevent the control circuit from an endless loop of erase repair. This number can be, for example, 20, 30, 40 or more.

Once the over-erase repair is completed and step 478 is passed successfully, step 488 flips the WL signal to logic 1 and passes the procedure to step 490. Step 490 determines whether the last address is complete. If not, the scanning for the next erased wordline is performed in step 492 and the procedure is returned to step 476. If yes, the decision step 494 is performed. Step 494 determines whether all the wordlines are step to logic 1. If not, it means that there are selected cells not yet erased and the erase procedure returns to step 472. If so, step 496 is performed to complete the erase procedure.

Again, based on the FIG. 10 flowchart, the details about the WL driver 400 are described. When starting a single wordline erase procedure, the first step is to initialize all the rows, including the redundant rows. The erase inhibit level is applied by enabling the signals SET and T0–T7 to logic 1 in a pulse manner and by disabling T0B–T7B to logic 0. Meanwhile, the transistors (420a–g, 422a–g, 424a–g) are in the states (on, off, on) and the voltage level (VMP, VPX1, VPP) are all VDD. After the erase setup, the following step is to change VPX1 to ground level and to decode the chosen row by RN, SN and T0–T7. T0B–T7B are kept at ground level throughout the erase procedure. Therefore, the logic 0 passes though the multiplexer selector 426 to line 410 and further to one of transistors 420a–g and 422a–g (based on T0–T7), so the previous erase inhibit voltage in one of the latches 402a–g is selectively flipped to the enable state for the selected wordline. Once the setup is completed, the single wordline erase is active by the flowchart procedure. The transistors (420a–g, 422a–g, 424a–g) are in the states (off, off, on) and the voltage level (VPP, VPN) are (0V, −10V). Note that the VPP is switched to 0V whenever the VPN is pumped to the relative low voltage (e.g. −5V). The purpose is so that the reverse voltage between the junction of N+/P-well and P+/N-well is reduced.

The multiple wordline erase is performed in the same manner as the single wordline erase procedure except for sending the erase enable voltage to multiple wordlines. However, if the selected block needs to be erased, activating the voltage level (T0–T7, MODE, VPX1) to be (VDD, 0V, 0V) in order to erase the whole block is preferred over a row by row technique.

With respect to the chip erase, an initialization is performed by a RESETB pulse to all the rows. To enable all the second stage of the wordline 406, 408, (T0–T7, T0B–T7B) are set to (VDD, 0) respectively. The first stage of wordline 400 is also reset to logic low by RESETB, activating the selector 426 to couple the VPX1 signal to the wordline via line 410 with erase enable voltage. After the initialization, the next scanning procedure is proceeded by a sequencer controlled by the embedded controller. Once the row (block) address matches the defective address stored in the CAM set, the erase inhibit voltage coming from VPX1 is applied to the bad row (block) by activating the first stage wordline 400, for example, T0 (T0–T7). When the scanning is complete, the entire memory is erased.

After erasing, the unique design for the WL driver can supply three kinds of voltage during erase verify, over-erase verify and over-erase repair operation. (See U.S. Pat. Ser. No. 08/676,066). The three voltages are applied to different cells of the associated wordlines that are distinguished from each other as the selected, unerased and unselected wordline separately. The first one is applied with a low voltage (e.g. 1V) for erase verify, a low voltage (e.g. 0.5V) for over-erase verify and a relatively high voltage (e.g. 5V) for over-erase repair. The second one applies 0V to all the unerased wordlines to shut off the cells. The third one applies a negative voltage (−LV e.g. −5V–−2V) which depends on the minimum threshold voltage of the over-erased cell to the unselected but erased wordlines. For clarity, an example is described below.

Referring to FIG. 8, the scanning scheme is used to check the state of each wordline by reading out the latched value though the multiplexer 426 to the line VPX1. During the step, the transistors (420a–g, 422a–g, 424a–g) are in the state (on, off, on) and the voltage levels (VPP, VPN) are (VDD, 0V). If the voltage level of WL0–WL7 are (0V, VDD, 0V, VDD, VDD, VDD, VDD, VDD), the first scanned erased WL is WL0 and then reset WL0 to VDD. After resetting, all the wordlines are discharged to −LV (for 0V WL) and 0V (for VDD WL) except WL0. At this step, transistors (418, 406a, 406b–g, 408a, 408b–g, 420a–g, 422a–g, 424a–g) are in the state (one, on, off, off, on, off, on, off). Then the verify and repair voltage from VPX1 through multiplexer 426 can pass to WL0 as required. The other unerased wordlines are kept at 0V and unselected wordlines are kept at −LV. Note that the VPX1 signal and VMP signal can be pumped up if there is a requirement for the efficiency for repairing over-erased cells. That is also why a level shifter is built in the first stage of the wordline 400. The present invention provides the feature that even the unselected over-erased cells can be shut off during erase verify, over-erase verify and over-erase repair operation.

EMBODIMENT C

1. Architecture

Figure 11:
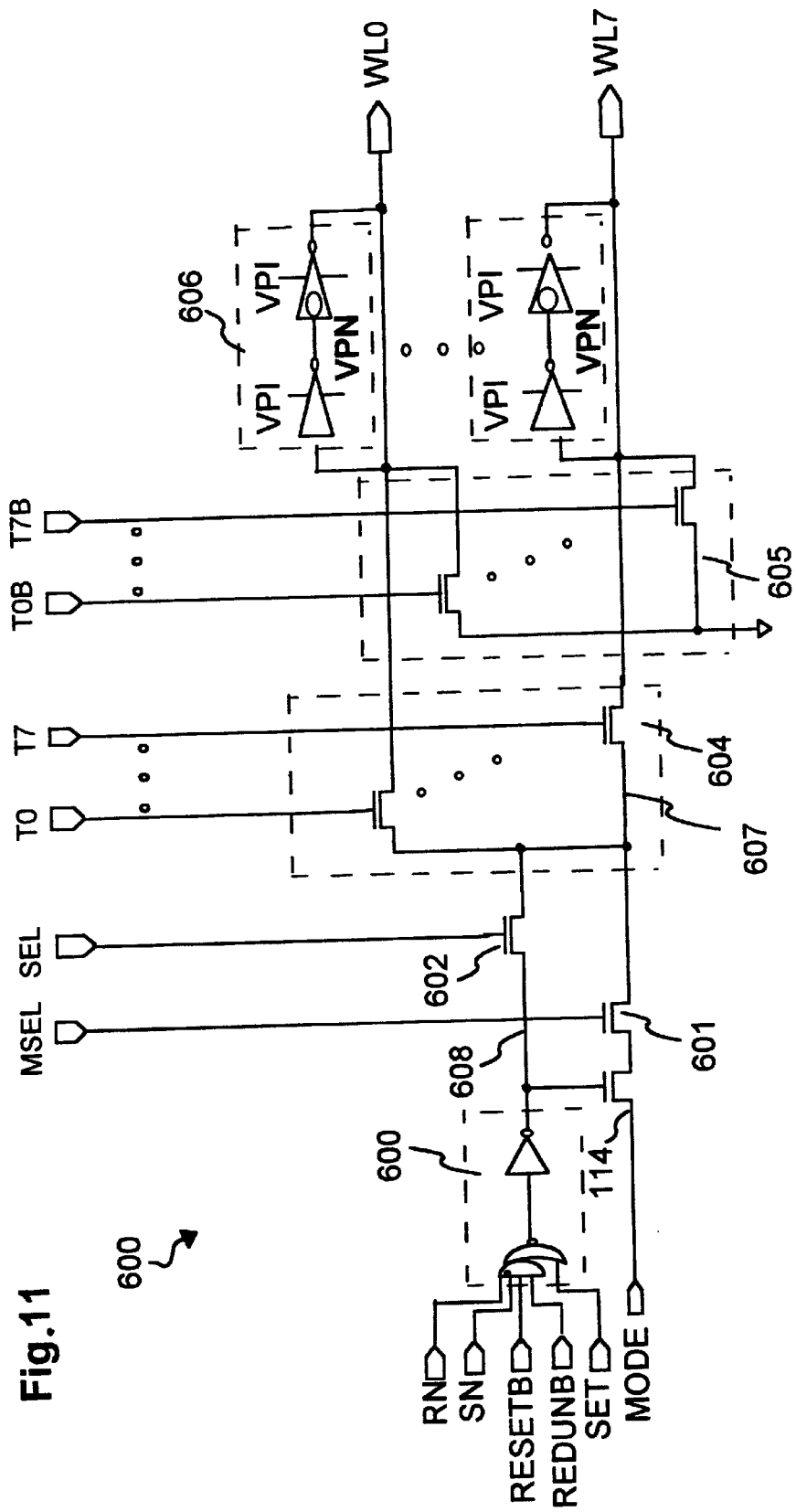
FIG. 11 depicts a regular WL driver according to an embodiment of the invention.
Figure 12:
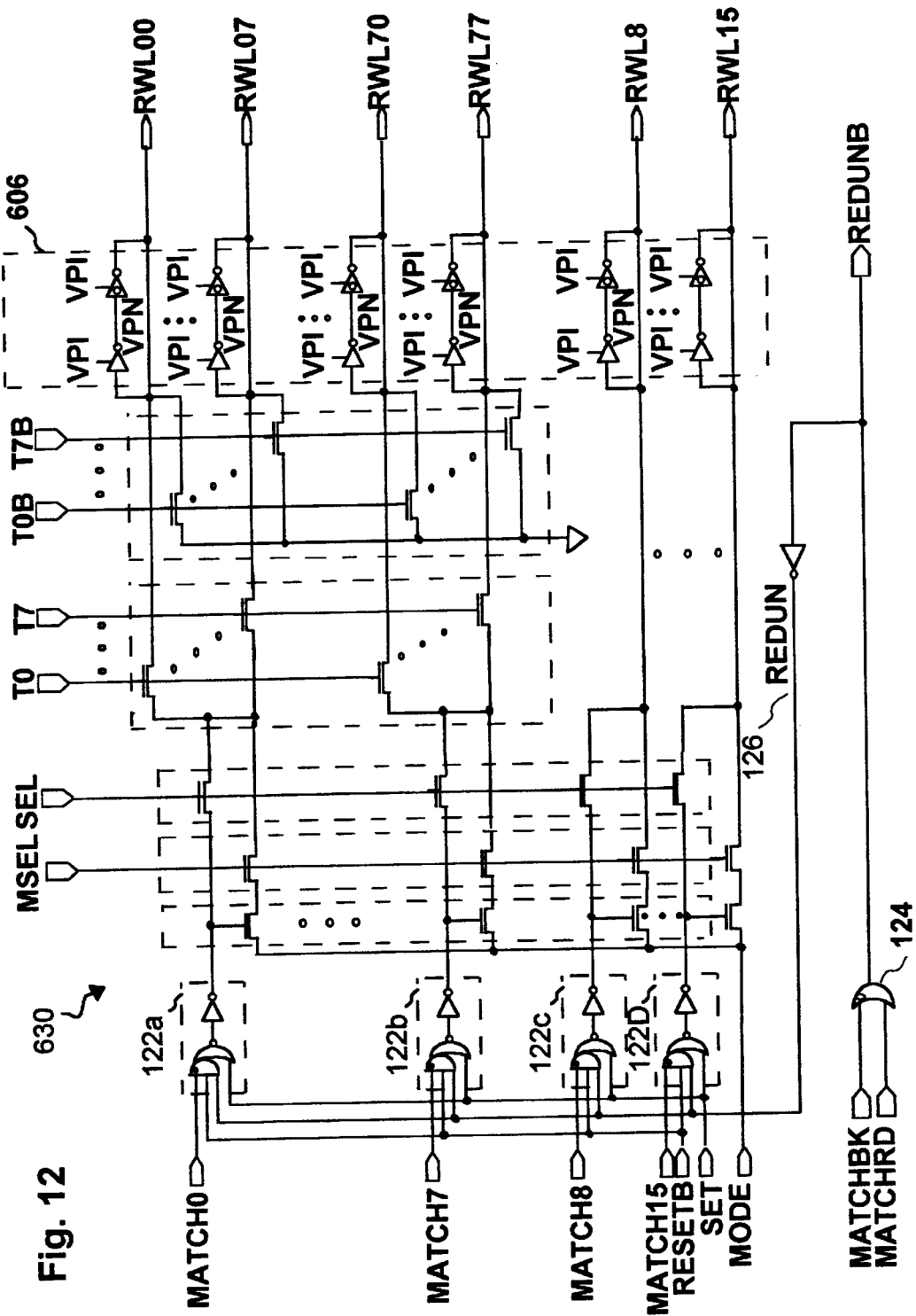
FIG. 12 depicts a redundant WL driver according to an embodiment of the invention.

FIGS. 11 and 12 depict the regular WL driver 600 and the redundant WL driver 630. Note that the WL drivers are similar to those in Embodiment A except that the power supply and well control are changed from 0V to VPN.

2. Read, Program and Erase Procedures

With respect to the read procedure and the program procedure, the read procedure is the same as Embodiment A, and the program procedure is the same as the single wordline erase procedure of Embodiment B.

The erase procedure is performed similar to Embodiment A. In order to eliminate the over-erase issue, the raising of the threshold voltage in this embodiment can easily be achieved. On the contrary, the lowering of the threshold voltage is defined as the program procedure. By using the Fowler-Nordheim tunneling technique or source side CHE injection technique, the former one can use the feature of multiple wordline erase and the latter one can only use the feature of single wordline erase. However, the continuous re-iteration for program and program verify can prevent the Vt from getting into the over-erased state (e.g. Vt<0.5V). Due to the bit by bit verifying technique applied to only one row (See U.S. Pat. Ser. No. 08/676,066), a program inhibit voltage can be applied to the passed cells' bit line during the next program procedure. Thus, the re-iteration can be accomplished without the over-erased issue.

With respect to the no over-erased issue, in FIG. 12, there is no more preprogram procedure needed that the matching signal REDUN can directly enable the row redundancy. In other words, no more glue logic as in the former two embodiments is shown here. Since the erase procedure is reversed to the other way here, the initialization for multiple erase may be changed. Referring to FIG. 11, the erase setup is almost the same as Embodiment A except the setting of the bias condition. Here, the Fowler-Nordheim tunneling scheme is explanatory that the erase inhibit voltage (e.g. 0V) is applied to all the wordlines by setting the voltage level (RESETB, MSEL, SEL, T0–T7, T0B–T7B) to (0V, 0V, VDD, VDD, 0V) first. Next the selected block is sent the VDD level from the line MODE to the corresponding wordlines by setting the transistor (601, 602, 603, 604) to (on, off, on, on, off). Again, the randomly individual wordline is set by the same procedure except the transistors (604, 605) are decoded by the associated T0–T7 and T0B–T7B. After the initialization, the selected wordlines are ramped to high voltage (e.g. 15V) and the unselected wordlines are kept at 0V or are ramped to relatively low voltage (e.g. 5V). However, the unselected wordline ramped to 5V through the common power source VPN will be the preferred technique because the drain disturbing effect is reduced significantly (e.g. 5V on BL). Also, the reverse voltage between the junction N+/P-well and P+/N-well can be reduced in the WL driver. Thus, the device reliability can also be improved.

VOLTAGE AND CURRENT PUMPS

The disclosed embodiments assume that any necessary power level is supplied. However, the disclosed embodiments can be combined with a charge or voltage pump generator to increase the voltage beyond that supplied, i.e. from VDD to VPP. Charge and voltage pumps are known in the art and example is given by way of reference to U.S. Pat. Nos. 4,679,134 and 4,812,961. The incorporation of a pump generator with the exemplary embodiments expands the operational voltages in order to facilitate improved yield and reliable retrieval of stored values.

For example, if the memory is supplied with VDD(+3.3V), and needs VPP(+10V) for a program function, the voltage pump generator creates the needed voltage and provides it to the decoder circuits to accomplish the necessary function. Likewise, the voltage pump can provide a negative voltage VPN(−10V) to the decoder circuits for the erase function.

CONCLUSION

The invention provides many advantages over known techniques. Advantages of the invention include improved row redundancy for wordline replacement and block replacement. Moreover, the inventive memory requires little external control and performs many of the enable and disable functions on chip. This improves the overall efficiency of a computer system.

Having disclosed exemplary embodiments and the best mode, modifications and variations may be made to the disclosed embodiments while remaining within the scope of the invention as defined by the following claims.

What is claimed is:

1. A flash memory with row redundancy, comprising:
   an input terminal to receive an address and a command signal;
   a flash transistor array having primary blocks and secondary blocks, each block including a plurality of transistors organized in rows and columns and having respective wordlines, bitlines and a sourceline;
   a wordline decoder coupled to said input terminal and to said primary blocks and configured to decode a portion of said address and to receive a control signal to selectively apply a predetermined voltage to a wordline;
   a bitline decoder coupled to said input terminal and to said primary blocks and said secondary blocks and configured to decode a portion of said address and to selectively pass a predetermined bitline to an output terminal;
   a match circuit coupled to said input terminal and to said secondary blocks and configured to decode a portion of said address and to receive said control signal to selectively apply a predetermined voltage to a wordline; and
   a control circuit coupled to said wordline decoder and said match circuit and configured to selectively activate one of said wordline decoder and said match circuit by said control signal.

2. The flash memory of claim 1, wherein:
   said match circuit includes a content addressable memory and a compare circuit configured to compare said address to said content addressable memory and to transmit a comparison signal to said control circuit; and
   said control circuit is configured to receive said comparison signal and to generate said control signal based at least in part on said comparison signal.

3. The flash memory of claim 2, wherein:
   said match circuit is configured to store in said content addressable memory an address of a defective wordline in said primary blocks and to activate a redundant wordline in said secondary blocks to replace said defective wordline.

4. The flash memory of claim 2, wherein:
   said match circuit is configured to store in said content addressable memory an address of a defective block in said primary blocks and to activate a redundant block in said secondary blocks to replace said defective block.

5. The flash memory of claim 2, wherein:

said match circuit is configured to store in said content addressable memory an address of a defective wordline in said primary blocks and to activate a redundant wordline in said secondary blocks to replace said defective wordline; and said match circuit is configured to store in said content addressable memory an address of a defective block in said primary blocks and to activate a redundant block in said secondary blocks to replace said defective block.

6. The flash memory of claim 1, wherein:

said wordline decoder includes a latch configured to latch a selected wordline; and said match circuit includes a latch configured to latch a selected wordline.

7. The flash memory of claim 1, wherein:

said wordline decoder includes a latch configured to latch a selected wordline and to selectively apply one of a plurality of voltages to said wordline; and said match circuit includes a latch configured to latch a selected wordline and to selectively apply one of a plurality of voltages to said wordline.

8. The flash memory of claim 2, wherein:

said wordline decoder includes a latch configured to latch a selected wordline; and said match circuit includes a latch configured to latch a selected wordline.

9. The flash memory of claim 2, wherein:

said wordline decoder includes a latch configured to latch a selected wordline and to selectively apply one of a plurality of voltages to said wordline; and said match circuit includes a latch configured to latch a selected wordline and to selectively apply one of a plurality of voltages to said wordline.

10. The flash memory of claim 6, wherein:

said control circuit is configured to scan through said primary blocks and said secondary blocks to identify defective rows and to set said latches.

11. The flash memory of claim 8, wherein:

said control circuit is configured to scan through said primary blocks and said secondary blocks to identify defective rows and to set said latches.

12. A method of constructing a flash memory with row redundancy comprising the steps of:

forming an input terminal to receive an address and a command signal;

forming a flash transistor array having primary blocks and secondary blocks, each block including a plurality of transistors organized in rows and columns and having respective wordlines, bitlines and a sourceline;

coupling a wordline decoder to said input terminal and said primary blocks;

coupling a match circuit to said input terminal and said secondary blocks;

coupling a control circuit to said input terminal, said wordline decoder and said match circuit; and coupling a bitline decoder to said input terminal and said flash transistor array.

13. The method of claim 12, further comprising the step of:

coupling a sourceline decoder to said flash transistor array.

14. The method of claim 12, wherein:

said wordline decoder is constructed to have a latch configured to latch selected wordlines; and said match circuit is constructed to have a latch configured to latch selected wordlines.

15. The method of claim 13, wherein:

said wordline decoder is constructed to have a latch configured to latch selected wordlines;

said match circuit is constructed to have a latch configured to latch selected wordlines; and said sourceline decoder is constructed to have a latch configured to latch a selected sourceline.

16. The method of claim 12, wherein:

said match circuit is constructed to have a content addressable memory and a comparator circuit configured to compare an address to said content addressable memory and generate a match signal.

17. The method of claim 13, wherein:

said match circuit is constructed to have a content addressable memory and a comparator circuit configured to compare an address to said content addressable memory and generate a match signal.

18. The method of claim 14, wherein:

said match circuit is constructed to have a content addressable memory and a comparator circuit configured to compare an address to said content addressable memory and generate a match signal.

19. The method of claim 15, wherein:

said match circuit is constructed to have a content addressable memory and a comparator circuit configured to compare an address to said content addressable memory and generate a match signal.

20. A method of storing and retrieving information in a flash memory with row redundancy having an input terminal, a flash transistor array with primary blocks and secondary blocks where each block includes a plurality of transistors organized in rows and columns and has respective wordlines, bitlines and a sourceline, a wordline decoder coupled to said flash transistor array, a match circuit coupled to said flash transistor array, a control circuit coupled to said wordline decoder and said match circuit, a bitline decoder coupled to said flash transistor array and an output terminal, comprising the steps of:

receiving an address and a command signal;

decoding a portion of said address in said wordline decoder receiving a control signal to selectively apply a predetermined voltage to a wordline in said primary blocks;

decoding a portion of said address in said bitline decoder to selectively pass a predetermined bitline to said output terminal;

decoding a portion of said address in said match circuit and receiving said control signal to selectively apply a predetermined voltage to a wordline in said secondary blocks; and selectively activating via said control circuit one of said wordline decoder and said match circuit by said control signal.

21. The method of claim 20, wherein said match circuit includes a content addressable memory, and said method further comprises the step of:

comparing said address to said content addressable memory to transmit a comparison signal to said control circuit; and wherein said selectively activating step is performed by receiving said comparison signal and generating said control signal based at least in part on said comparison signal.

22. The method of claim 21, further comprising the step of:

storing in said content addressable memory an address of a defective wordline in said primary blocks and activating a redundant wordline in said secondary blocks to replace said defective wordline.

23. The method of claim 21, further comprising the step of:

storing in said content addressable memory an address of a defective block in said primary blocks and activating a redundant block in said secondary blocks to replace said defective block.

24. The method of claim 21, further comprising the steps of:

storing in said content addressable memory an address of a defective wordline in said primary blocks and activating a redundant wordline in said secondary blocks to replace said defective wordline; and storing in said content addressable memory an address of a defective block in said primary blocks and activating a redundant block in said secondary blocks to replace said defective block.

25. The method of claim 20, further comprising the step of one of:

latching a selected wordline in said primary blocks; and latching a selected wordline in said secondary blocks.

26. The method of claim 20, further comprising the step of one of:

latching a selected wordline in said primary blocks and applying one of a plurality of voltages to said selected wordline; and latching a selected wordline in said secondary blocks and applying one of a plurality of voltages to said selected wordline.

27. The method of claim 21, further comprising the step of one of:

latching a selected wordline in said primary blocks; and latching a selected wordline in said secondary blocks.

28. The method of claim 21, further comprising the step of one of:

latching a selected wordline in said primary blocks and applying one of a plurality of voltages to said selected wordline; and latching a selected wordline in said secondary blocks and applying one of a plurality of voltages to said selected wordline.

29. The method of claim 25, further comprising the step of:

scanning through said primary blocks and said secondary blocks to identify defective rows and to set said latches.

30. The method of claim 27, further comprising the step of:

scanning through said primary blocks and said secondary blocks to identify defective rows and to set said latches.

* * * * *